United States Patent
Chung et al.

(10) Patent No.: US 9,698,133 B2
(45) Date of Patent: *Jul. 4, 2017

(54) METHOD OF MANUFACTURING A MULTICHIP PACKAGE STRUCTURE

(71) Applicant: PARAGON SEMICONDUCTOR LIGHTING TECHNOLOGY CO., LTD., New Taipei (TW)

(72) Inventors: Chia-Tin Chung, Miaoli County (TW); Fang-Kuei Wu, Taoyuan County (TW)

(73) Assignee: PARAGON SEMICONDUCTOR LIGHTING TECHNOLOGY CO., LTD, New Taipei (TW)

( * ) Notice: Subject to any disclaimer, the term of this patent is extended or adjusted under 35 U.S.C. 154(b) by 84 days.

This patent is subject to a terminal disclaimer.

(21) Appl. No.: 14/815,918

(22) Filed: Jul. 31, 2015

(65) Prior Publication Data

US 2015/0340352 A1 Nov. 26, 2015

Related U.S. Application Data

(60) Division of application No. 13/633,877, filed on Oct. 3, 2012, now abandoned, which is a
(Continued)

(30) Foreign Application Priority Data

Jul. 6, 2009 (TW) ................................. 98122751 A

(51) Int. Cl.
*H01L 33/00* (2010.01)
*H01L 25/00* (2006.01)
(Continued)

(52) U.S. Cl.
CPC ................ *H01L 25/50* (2013.01); *F21K 9/68* (2016.08); *F21V 31/04* (2013.01); *H01L 23/24* (2013.01);
(Continued)

(58) Field of Classification Search
CPC ............................... H01L 33/54; H01L 33/56
See application file for complete search history.

(56) References Cited

U.S. PATENT DOCUMENTS 6,646,039 B2 * 11/2003 Li ............................ C08K 9/06
524/492
7,521,728 B2 * 4/2009 Andrews ................ H01L 33/52
257/100

(Continued)

*Primary Examiner* — Jerome Jackson, Jr.
(74) *Attorney, Agent, or Firm* — Pai Patent & Trademark Law Firm; Chao-Chang David Pai

(57) ABSTRACT

A method of manufacturing a multichip package structure includes providing a substrate body; placing a plurality of light-emitting chips on the substrate body, the light-emitting chips being electrically connected to the substrate body; surroundingly forming surrounding liquid colloid on the substrate body to surround the light-emitting chips; naturally drying an outer layer of the surrounding liquid colloid at a predetermined room temperature to form a semidrying surrounding light-reflecting frame, the semidrying surrounding light-reflecting frame having a non-drying surrounding colloid body disposed on the substrate body and a dried surrounding colloid body totally covering the non-drying surrounding colloid body; and then forming a package colloid body on the substrate body to cover the light-emitting chips, the semidrying surrounding light-reflecting frame contacting and surrounding the package colloid body.

10 Claims, 20 Drawing Sheets

Related U.S. Application Data continuation-in-part of application No. 12/557,462, filed on Sep. 10, 2009, now abandoned.

(51) Int. Cl.
| | |
|---|---|
| *H01L 25/075* | (2006.01) |
| *H01L 33/60* | (2010.01) |
| *F21V 31/04* | (2006.01) |
| *H01L 23/24* | (2006.01) |
| *F21K 9/68* | (2016.01) |
| *H01L 33/54* | (2010.01) |
| *H05K 1/02* | (2006.01) |
| *H05K 3/28* | (2006.01) |
| *F21Y 105/10* | (2016.01) |
| *F21Y 115/10* | (2016.01) |

(52) U.S. Cl.
CPC ......... *H01L 25/0753* (2013.01); *H01L 33/60* (2013.01); *F21Y 2105/10* (2016.08); *F21Y 2115/10* (2016.08); *H01L 33/54* (2013.01); *H01L 2224/05553* (2013.01); *H01L 2224/48091* (2013.01); *H01L 2924/181* (2013.01); *H01L 2933/0033* (2013.01); *H01L 2933/0058* (2013.01); *H05K 1/0203* (2013.01); *H05K 3/284* (2013.01); *H05K 2201/10106* (2013.01); *H05K 2201/2054* (2013.01)

(56) References Cited

U.S. PATENT DOCUMENTS

| | | | |
|---|---|---|---|
| 7,736,920 B1* | 6/2010 | Wu | H01L 24/32 257/E21.001 |
| 9,125,328 B2* | 9/2015 | Chung | H01L 33/54 |
| 9,433,103 B2* | 8/2016 | Chung | H01L 33/54 |
| 2011/0001152 A1* | 1/2011 | Chung | F21K 9/00 257/98 |

* cited by examiner

METHOD OF MANUFACTURING A MULTICHIP PACKAGE STRUCTURE

CROSS REFERENCE TO RELATED APPLICATION

This application is a Divisional application of Ser. No. 13/633,877 filed on Oct. 3, 2012, which is a Continuation-In-Part of pending U.S. patent application Ser. No. 12/557,462, filed on Sep. 10, 2009, and entitled "LED PACKAGE STRUCTURE FOR FORMING A STUFFED CONVEX LENS TO ADJUST LIGHT-PROJECTING ANGLE AND METHOD FOR MANUFACTURING THE SAME", which claims priority of Taiwan Patent Application No. 098122751, filed on Jul. 6, 2009, the entire disclosures of which are incorporated herein by reference.

BACKGROUND OF THE INVENTION

1. Field of the Invention

The instant disclosure relates to a method of manufacturing a multichip package structure, in particular, to a method of manufacturing a multichip package structure for forming a stuffed convex lens to adjust the light-projecting angle thereof and a method for manufacturing the same.

2. Description of Related Art

The invention of the lamp greatly changed the style of building construction and the living style of human beings, allowing people to work during the night. Without the invention of the lamp, we may stay in the living conditions of ancient civilizations.

The LED lamp has a plurality of LED chips and a white frame surrounding the LED chips for increasing the light-emitting efficiency of the LED lamp. However, the white frame is manufactured by a prefabricated frame mold, thus the manufacturing cost is increased. In addition, when the shape of the white frame needs to be changed, the frame mold also needs to be changed according to the new shape of the white frame, thus the shape of the frame mold follows the shape of the white frame. Hence, when a new white frame is created for a new product, a new frame mold needs to be developed.

SUMMARY OF THE INVENTION

One aspect of the instant disclosure relates to a method of manufacturing a multichip package structure. The multichip package structure includes a semidrying surrounding light-reflecting frame formed without using any frame mold.

One of the embodiments of the instant disclosure provides a method of manufacturing a multichip package structure, comprising the steps of: providing a substrate body; placing a plurality of light-emitting chips on the substrate body, wherein the light-emitting chips are electrically connected to the substrate body; surroundingly forming surrounding liquid colloid on the substrate body to surround the light-emitting chips; naturally drying an outer layer of the surrounding liquid colloid at a predetermined room temperature to form a semidrying surrounding light-reflecting frame, wherein the semidrying surrounding light-reflecting frame has a non-drying surrounding colloid body disposed on the substrate body and a dried surrounding colloid body totally covering the non-drying surrounding colloid body; and then forming a package colloid body on the substrate body to cover the light-emitting chips, wherein the semidrying surrounding light-reflecting frame contacts and surrounds the package colloid body. Furthermore, after the step of forming the package colloid body, the method further comprises: solidifying the semidrying surrounding light-reflecting frame by natural drying at the predetermined room temperature or curing at a predetermined curing temperature to form a dried surrounding light-reflecting frame.

Yet another one of the embodiments of the instant disclosure provides a method of manufacturing a multichip package structure, comprising the steps of: providing a substrate body; surroundingly forming surrounding liquid colloid on the substrate body; naturally drying an outer layer of the surrounding liquid colloid at a predetermined room temperature to form a semidrying surrounding light-reflecting frame, wherein the semidrying surrounding light-reflecting frame has a non-drying surrounding colloid body disposed on the substrate body and a dried surrounding colloid body totally covering the non-drying surrounding colloid body; placing a plurality of light-emitting chips on the substrate body, wherein the light-emitting chips are electrically connected to the substrate body and surrounded by the semidrying surrounding light-reflecting frame; and then forming a package colloid body on the substrate body to cover the light-emitting chips, wherein the semidrying surrounding light-reflecting frame contacts and surrounds the package colloid body. Furthermore, after the step of forming the package colloid body, the method further comprises: solidifying the semidrying surrounding light-reflecting frame by natural drying at the predetermined room temperature or curing at a predetermined curing temperature to form a dried surrounding light-reflecting frame.

Moreover, the semidrying surrounding light-reflecting frame has a convex junction portion or a concave junction portion formed on the top surface thereof. The semidrying surrounding light-reflecting frame is extended from an initial point to a terminal point, and the position of the initial point and the position of the terminal point are substantially the same. The semidrying surrounding light-reflecting frame has an arc shape formed on the top surface thereof, the semidrying surrounding light-reflecting frame has a radius tangent and the angle of the radius tangent relative to the top surface of the substrate body is between 40° and 50°, the maximum height of the semidrying surrounding light-reflecting frame relative to the top surface of the substrate body is between 0.3 mm and 0.7 mm, the width of the bottom side of the semidrying surrounding light-reflecting frame is between 1.5 mm and 3 mm, the thixotropic index of the semidrying surrounding light-reflecting frame is between 4 and 6, and the semidrying surrounding light-reflecting frame is formed by mixing inorganic additive with white thermohardening colloid. The substrate unit includes a plurality of positive pads disposed on the top surface of the substrate body and a plurality of negative pads disposed on the top surface of the substrate body, wherein each light-emitting chip has a positive electrode and a negative electrode, the positive electrode of each light-emitting chip corresponds to at least two of the positive pads, and the negative electrode of each light-emitting chip corresponds to at least two of the negative pads. The positive electrode of each light-emitting chip is electrically connected to one of the two corresponding positive pads, and the negative electrode of each light-emitting chip is electrically connected to one of the two corresponding negative pads.

Therefore, the semidrying surrounding light-reflecting frame can be formed on the substrate body without using any frame mold in the instant disclosure.

To further understand the techniques, means and effects of the instant disclosure applied for achieving the prescribed objectives, the following detailed descriptions and appended drawings are hereby referred, such that, through which, the purposes, features and aspects of the instant disclosure can be thoroughly and concretely appreciated. However, the appended drawings are provided solely for reference and illustration, without any intention to limit the instant disclosure.

BRIEF DESCRIPTION OF THE DRAWINGS

FIGS. 11A to 14B are schematic views of the LED package structure according to the third embodiment of the instant disclosure, at different stages of the packaging processes, respectively;

DETAILED DESCRIPTION OF THE PREFERRED EMBODIMENTS

[First Embodiment]

Referring to FIG. 1 to FIG. 7, where the first embodiment of the instant disclosure provides a method of manufacturing a multichip package structure for increasing the light-emitting efficiency and the light-projecting angle.

Figure 1:
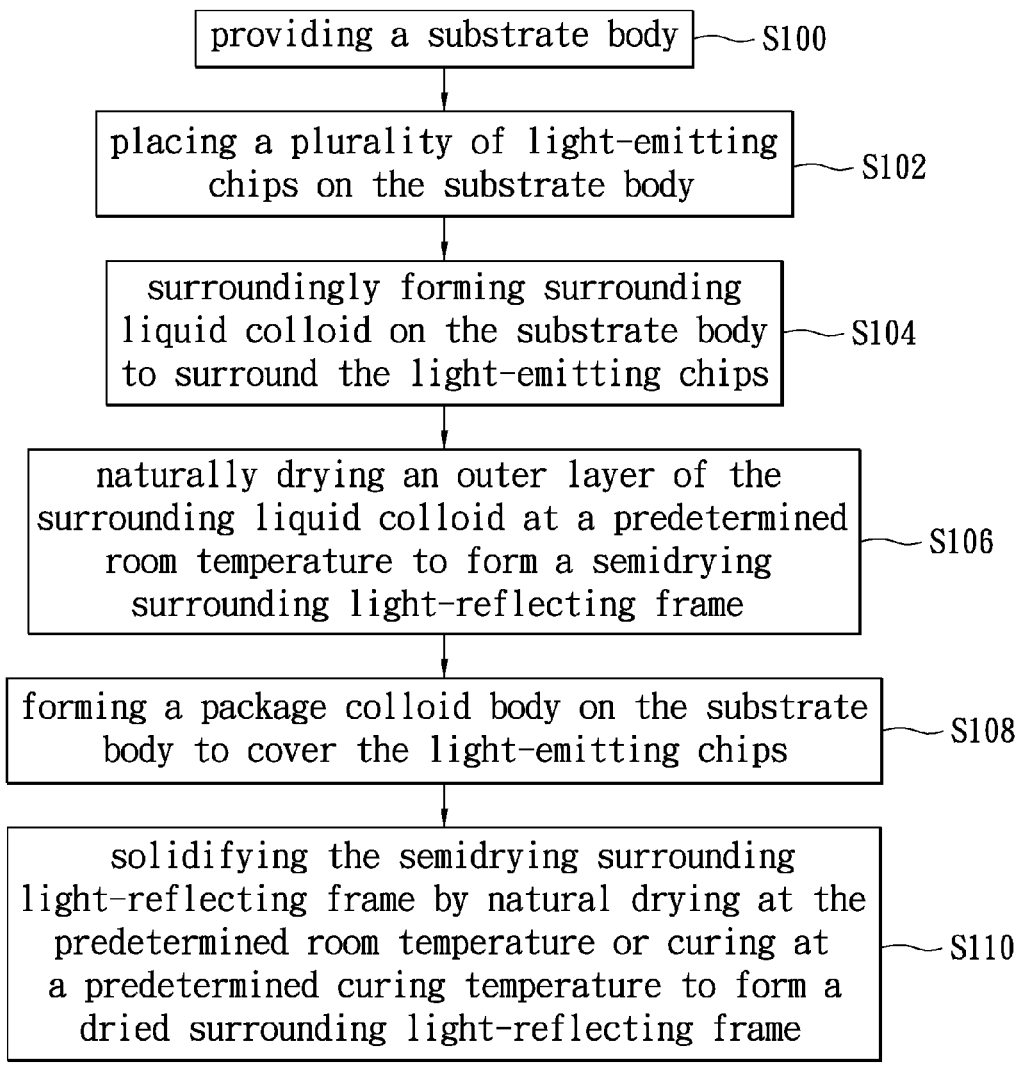
FIG. 1 shows a flowchart of the method of manufacturing a multichip package structure according to the first embodiment of the instant disclosure.

Referring to FIG. 1, the method of manufacturing a multichip package structure of the first embodiment of the instant disclosure, comprising the steps of: providing a substrate body (S100); placing a plurality of light-emitting chips on the substrate body, wherein the light-emitting chips are electrically connected to the substrate body (S102); surroundingly forming surrounding liquid colloid on the substrate body to surround the light-emitting chips (S104); naturally drying an outer layer of the surrounding liquid colloid at a predetermined room temperature to form a semidrying surrounding light-reflecting frame, wherein the semidrying surrounding light-reflecting frame has a non-drying surrounding colloid body disposed on the substrate body and a dried surrounding colloid body totally covering the non-drying surrounding colloid body (S106); forming a package colloid body on the substrate body to cover the light-emitting chips, wherein the semidrying surrounding light-reflecting frame contacts and surrounds the package colloid body (S108); and then solidifying the semidrying surrounding light-reflecting frame by natural drying at the predetermined room temperature or curing at a predetermined curing temperature to form a dried surrounding light-reflecting frame (S110).

Figure 2A:
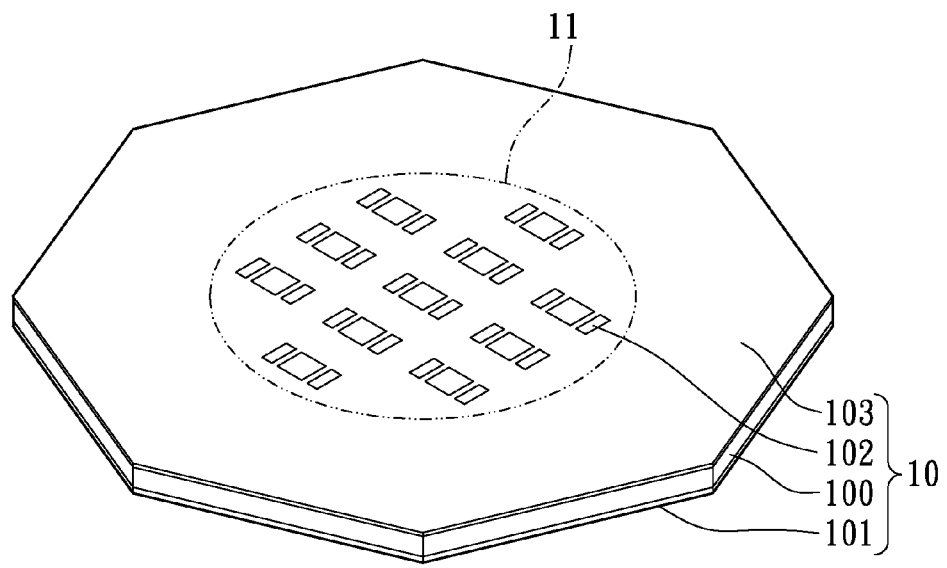
FIG. 2A shows a perspective, schematic view of the step S100 according to the first embodiment of the instant disclosure.
Figure 2B:
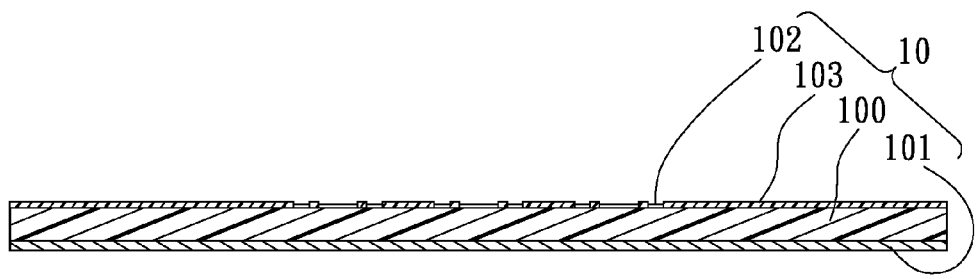
FIG. 2B shows a cross-sectional, schematic view of the step S100 according to the first embodiment of the instant disclosure.

Referring to FIGS. 1, 2A and 2B, the method comprises: providing a substrate body 10 (step S100). For example, the substrate body 10 has a chip-mounting area 11 disposed on the top surface thereof, and the substrate body 10 has a circuit substrate 100, a heat-dissipating layer 101 disposed on the bottom surface of the circuit substrate 100, a plurality of conductive pads 102 and a plurality of chip-mounting pads disposed on the top surface of the circuit substrate 100, and an insulating layer 103 disposed on the top surface of the circuit substrate 100 to expose the conductive pads 102. Hence, the heat-dissipating efficiency of the circuit substrate 100 can be increased by using the heat-dissipating layer 101, and the insulating layer 103 may be a solder mask for only exposing the conductive pads 102. However, the substrate body 10 used in the first embodiment is merely an example and is not meant to limit the instant disclosure.

Figure 3A:
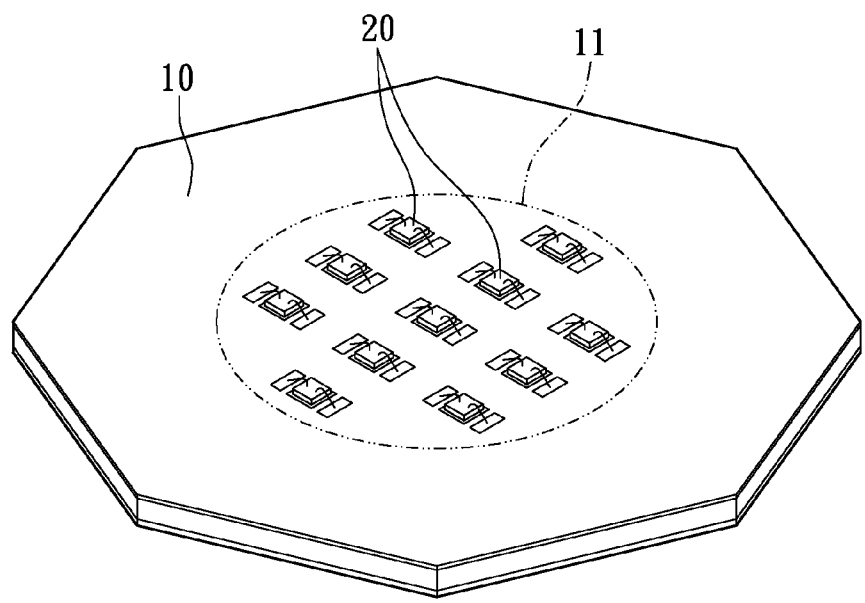
FIG. 3A shows a perspective, schematic view of the step S102 according to the first embodiment of the instant disclosure.
Figure 3B:
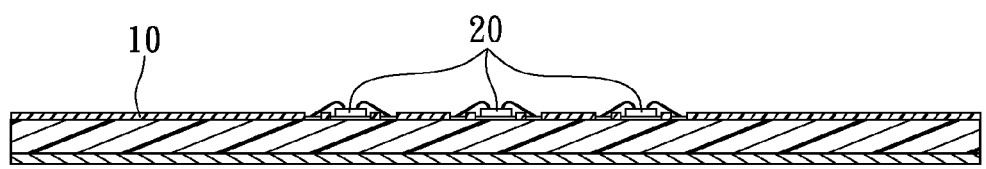
FIG. 3B shows a cross-sectional, schematic view of the step S102 according to the first embodiment of the instant disclosure.

Referring to FIGS. 1, 3A and 3B, the method comprises: placing a plurality of light-emitting chips 20 on the substrate body 10 (step S102), where each light-emitting chip may be a LED chip, and the light-emitting chips 20 are disposed on the chip-mounting area 11 and electrically connected to the substrate body 10. In other words, a predetermined chip-mounting area 11 can be formed on the substrate body 10 in advance, thus the light-emitting chips 20 can be placed on the chip-mounting area 11 of the substrate body 10 for electrically connecting to the substrate body 10. In the first embodiment, the light-emitting chips 20 can be electrically connected to the substrate body 10 by wire bonding. In addition, each chip-mounting pad is disposed between two corresponding conductive pads 102, and each light-emitting chip 20 is disposed each corresponding chip-mounting pad and electrically connected between two corresponding conductive pads 102.

Figure 4A:
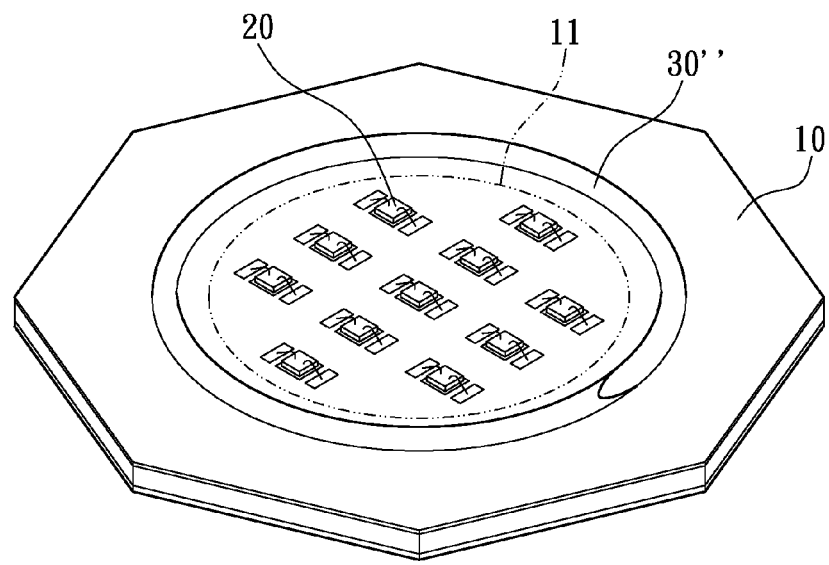
FIG. 4A shows a perspective, schematic view of the step S104 according to the first embodiment of the instant disclosure.
Figure 4B:
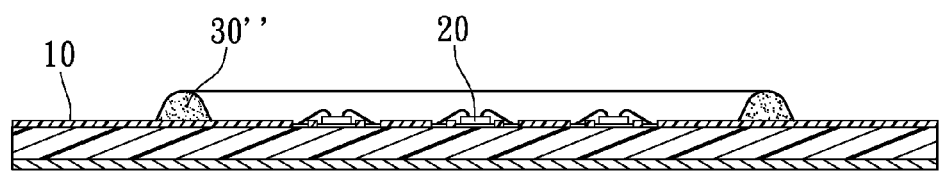
FIG. 4B shows a cross-sectional, schematic view of the step S104 according to the first embodiment of the instant disclosure.

Referring to FIGS. 1, 4A and 4B, the method comprises: surroundingly forming surrounding liquid colloid 30″ on the substrate body 10 to surround the light-emitting chips 20 (step S104), where the surrounding liquid colloid 30″ can be formed as a predetermined shape (such as a circular shape, a square or a rectangular shape etc.) on the substrate body 10 by coating according to different requirements. The thixotropic index of the surrounding liquid colloid 30″ may be between 4 and 6, the pressure of coating the surrounding liquid colloid 30″ on the top surface of the substrate body 10 may be between 350 kpa and 450 kpa, and the velocity of coating the surrounding liquid colloid 30″ on the top surface of the substrate body 10 may be between 5 mm/s and 15 mm/s. The surrounding liquid colloid 30″ can be surroundingly coated on the top surface of the substrate body 10 from an initial point to a terminal point, and the position of the initial point and the position of the terminal point are substantially the same.

Figure 5A:
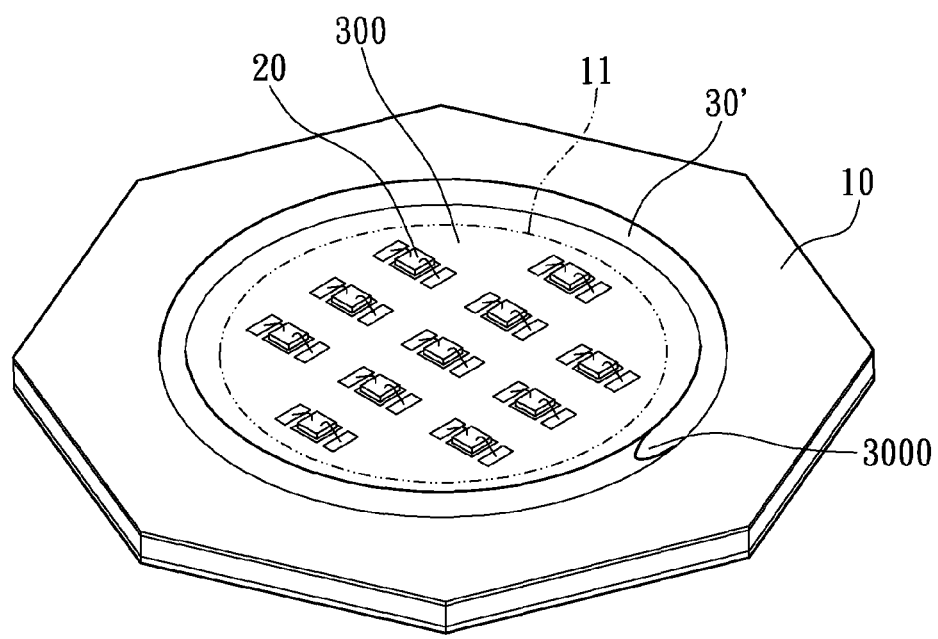
FIG. 5A shows a perspective, schematic view of the step S106 according to the first embodiment of the instant disclosure.
Figure 5B:
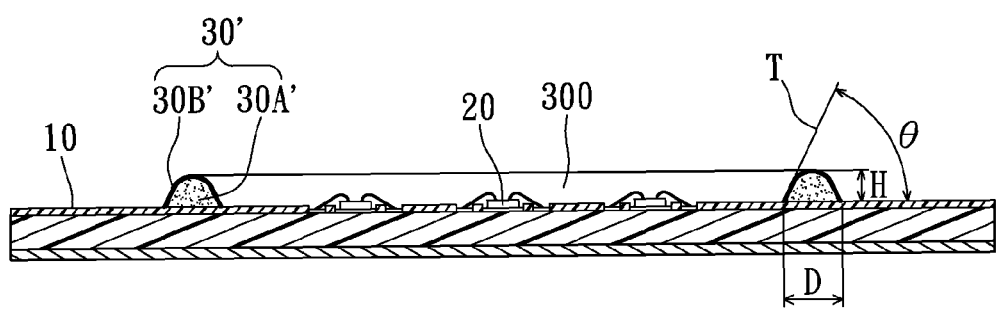
FIG. 5B shows a cross-sectional, schematic view of the step S106 according to the first embodiment of the instant disclosure.

Referring to FIGS. 1, 5A and 5B, the method comprises: naturally drying an outer layer of the surrounding liquid colloid 30″ at a predetermined room temperature (such as 25° or 20°~30°) without any curing device to form a semidrying surrounding light-reflecting frame 30', where the semidrying surrounding light-reflecting frame 30' has a non-drying surrounding colloid body 30A' (such as surrounding liquid colloid that is not to be dried) disposed on the substrate body 10 and a dried surrounding colloid body 30B' (such as surrounding solidifying colloid that is dried) totally covering the non-drying surrounding colloid body 30A' (step S106). For example, the semidrying surrounding light-reflecting frame 30' can be extended from an initial point to a terminal point, and the position of the initial point and the position of the terminal point are substantially the same, thus the semidrying surrounding light-reflecting frame 30' has a convex or concave junction portion 3000 formed on the top surface thereof. Moreover, the semidrying surrounding light-reflecting frame 30' has an arc shape formed on the top surface thereof. The semidrying surrounding light-reflecting frame 30' has a radius tangent T and the angle θ of the radius tangent T relative to the top surface of the substrate body 10 may be between 40° and 50°. The maximum height H of the semidrying surrounding light-reflecting frame 30' relative to the top surface of the substrate body 10 may be between 0.3 mm and 0.7 mm, and the width D of the bottom side of the semidrying surrounding light-reflecting frame 30' may be between 1.5 mm and 3 mm. The thixotropic index of the semidrying surrounding light-reflecting frame 30' may be between 4 and 6, and the semidrying surrounding light-reflecting frame 30' may be formed by mixing inorganic additive with white thermohardening colloid. In addition, the semidrying surrounding light-reflecting frame 30' surrounds the light-emitting chips 20 to form a colloid position limiting space 300 on the chip-mounting area 11 of the substrate body 10.

Figure 6A:
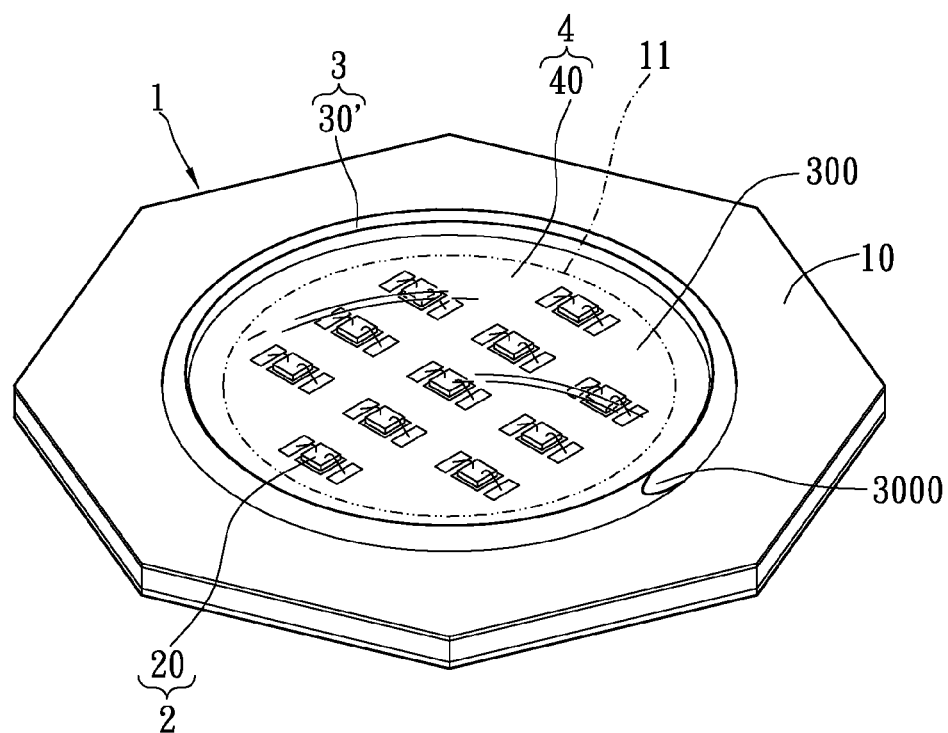
FIG. 6A shows a perspective, schematic view of the step S108 according to the first embodiment of the instant disclosure.
Figure 6B:
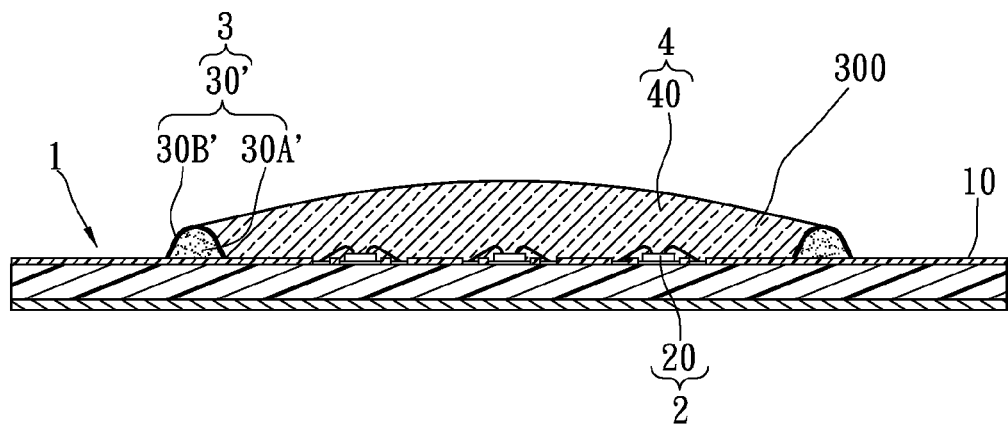
FIG. 6B shows a cross-sectional, schematic view of the step S108 according to the first embodiment of the instant disclosure.

Referring to FIGS. 1, 6A and 6B, the method comprises: forming a package colloid body 40 on the substrate body 10 to cover the light-emitting chips 20, where the semidrying surrounding light-reflecting frame 30' contacts and surrounds the package colloid body 40 (step S108). For example, the package colloid body 40 may be a light-transmitting resin body inside the colloid position limiting space 300, and the package colloid body 40 has a convex top surface.

Hence, referring to FIGS. 6A and 6B and the steps from S100 to S108, the first embodiment of the instant disclosure provides a multichip package structure for increasing the light-emitting efficiency and the light-projecting angle, comprising: a substrate unit 1, a light-emitting unit 2, a frame unit 3 and a package unit 4. The substrate unit 1 includes a substrate body 10. The light-emitting unit 2 includes a plurality of light-emitting chips 20 disposed on the substrate body 10 and electrically connected to the substrate body 10. The frame unit 3 includes a semidrying surrounding light-reflecting frame 30' surroundingly disposed on the substrate body 10. The light-emitting chips 20 are surrounded by the semidrying surrounding light-reflecting frame 30', and the semidrying surrounding light-reflecting frame 30' has a non-drying surrounding colloid body 30A' disposed on the substrate body 10 and a dried surrounding colloid body 30B' totally covering the non-drying surrounding colloid body 30A'. The package unit 4 includes a package colloid body 40 disposed on the substrate body 10 to cover the light-emitting chips 20, and the semidrying surrounding light-reflecting frame 30' contacts and surrounds the package colloid body 40.

Figure 7:
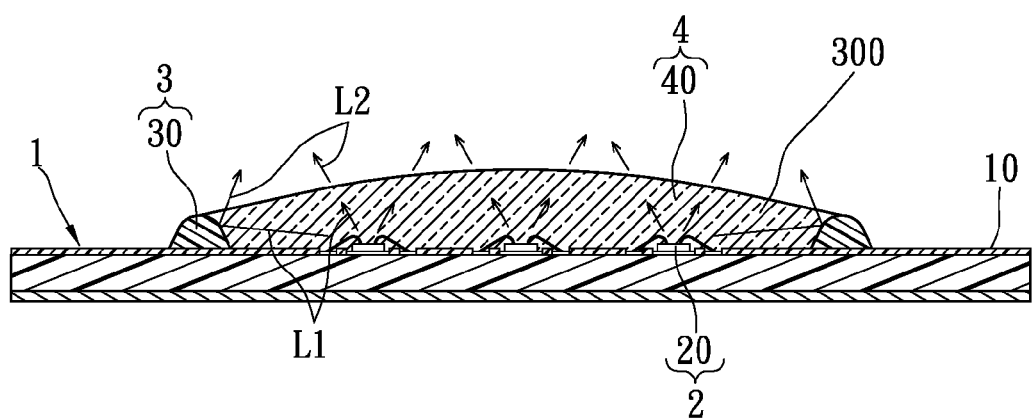
FIG. 7 shows a cross-sectional, schematic view of the step S110 according to the first embodiment of the instant disclosure.

Referring to FIGS. 1 and 7, after the step of forming the package colloid body 40 (the step S108), the method further comprises: solidifying the semidrying surrounding light-reflecting frame 30' by natural drying at the predetermined room temperature or curing at a predetermined curing temperature to form a dried surrounding light-reflecting frame 30 (step S110). For example, in the first embodiment, each light-emitting chip 20 may be a blue LED chip, and the package colloid body 40 may be a phosphor resin body, thus blue light beams L1 generated by the light-emitting chips 20 (the blue LED chips) can pass through the package colloid body 40 (the phosphor resin body) to generate white light beams L2 that are similar to the light source generate by sun lamp.

In conclusion, when the position of the package colloid body 40 can be limited in the colloid position limiting space 300 by using the dried surrounding light-reflecting frame 30, the usage quantity of the package colloid body 40 can be controlled by the designer. In addition, the surface shape and the height of the package colloid body 40 can be adjusted by control the usage quantity of the package colloid body 40, thus light-projecting angle of the white light beams L2 can be adjusted by different surface shapes and heights of the package colloid body 40. Moreover, the blue light beams L1 generated by the light-emitting chips 20 can be reflected by an inner wall of the dried surrounding light-reflecting frame 30 in order to increase the light-emitting efficiency of the multichip package structure of the instant disclosure. In other words, the position of the package colloid body 40 such as the phosphor resin body can be limited inside the colloid position limiting space 300 by using the dried surrounding light-reflecting frame 30, and the shape of the package colloid body 40 can be adjusted by using the dried surrounding light-reflecting frame 30, thus the light-emitting efficiency and the light-projecting angle of the multichip package structure of the instant disclosure can be increased.

[Second Embodiment]

Referring to FIG. 8 and FIGS. 9A to 9E, where the second embodiment of the instant disclosure provides a method of manufacturing a multichip package structure for increasing the light-emitting efficiency and the light-projecting angle.

Figure 8:
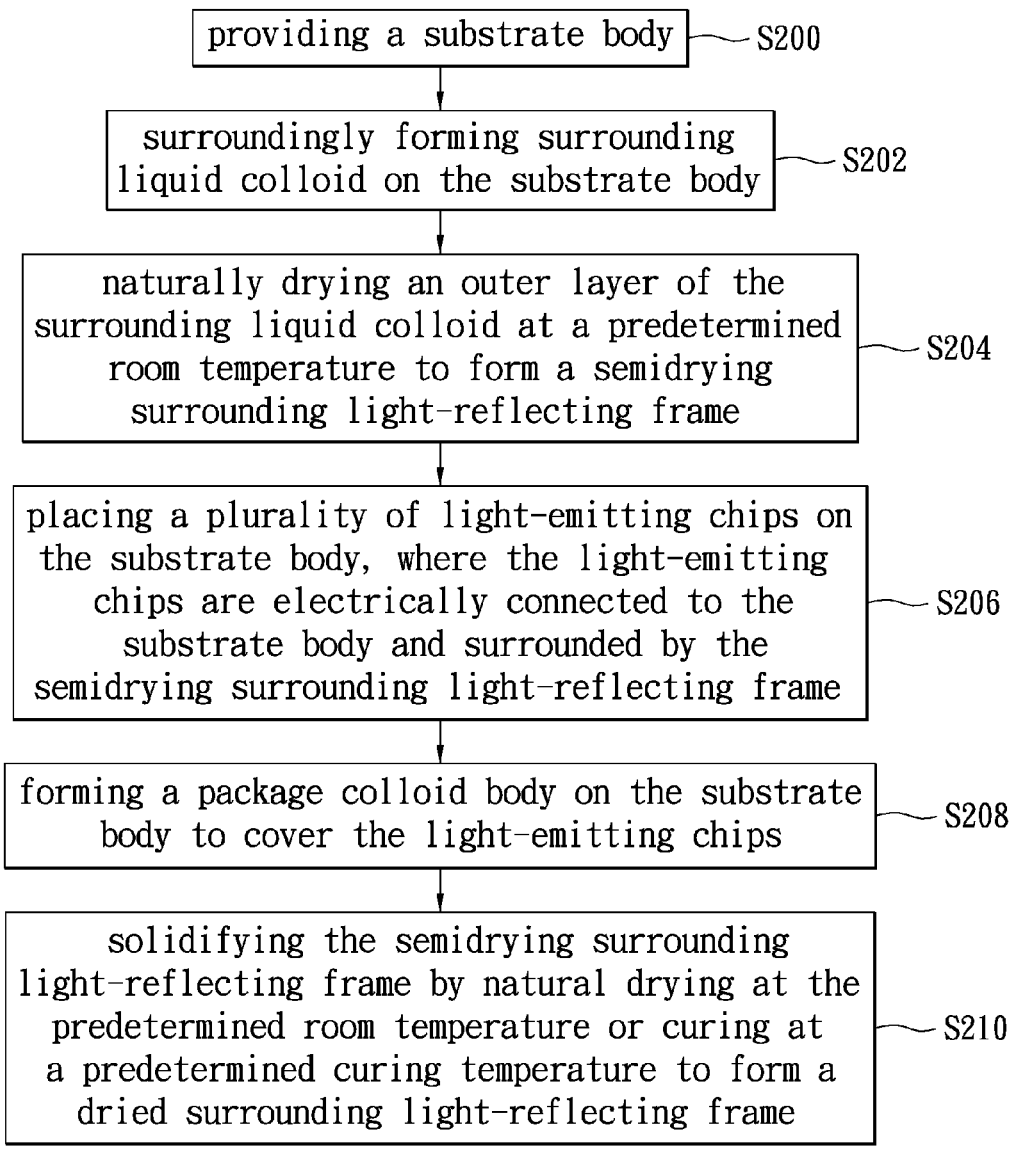
FIG. 8 shows a flowchart of the method of manufacturing a multichip package structure according to the second embodiment of the instant disclosure.

Referring to FIG. 8, the method of manufacturing a multichip package structure of the second embodiment of the instant disclosure, comprising the steps of: providing a substrate body (S200); surroundingly forming surrounding liquid colloid on the substrate body (S202); naturally drying an outer layer of the surrounding liquid colloid at a predetermined room temperature to form a semidrying surrounding light-reflecting frame, wherein the semidrying surrounding light-reflecting frame has a non-drying surrounding colloid body disposed on the substrate body and a dried surrounding colloid body totally covering the non-drying surrounding colloid body (S204); placing a plurality of light-emitting chips on the substrate body, wherein the light-emitting chips are electrically connected to the substrate body and surrounded by the semidrying surrounding light-reflecting frame (S206); forming a package colloid body on the substrate body to cover the light-emitting chips, wherein the semidrying surrounding light-reflecting frame contacts and surrounds the package colloid body (S208); and then solidifying the semidrying surrounding light-reflecting frame by natural drying at the predetermined room temperature or curing at a predetermined curing temperature to form a dried surrounding light-reflecting frame (S210).

Figure 9A:
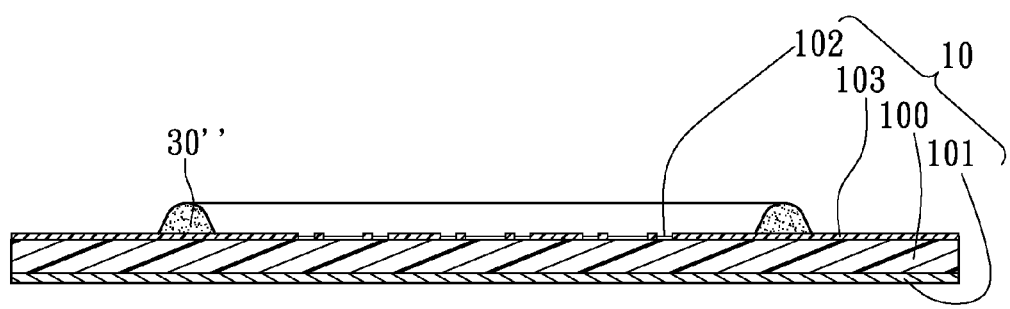
FIG. 9A shows a cross-sectional, schematic view of the step S200 and S202 according to the second embodiment of the instant disclosure.

Referring to FIGS. 8 and 9A, the method comprises: providing a substrate body 10 (step S200). For example, the substrate body 10 has a chip-mounting area (not shown) disposed on the top surface thereof, and the substrate body 10 has a circuit substrate 100, a heat-dissipating layer 101 disposed on the bottom surface of the circuit substrate 100, a plurality of conductive pads 102 disposed on the top surface of the circuit substrate 100, and an insulating layer 103 disposed on the top surface of the circuit substrate 100 to expose the conductive pads 102.

Figure 9B:
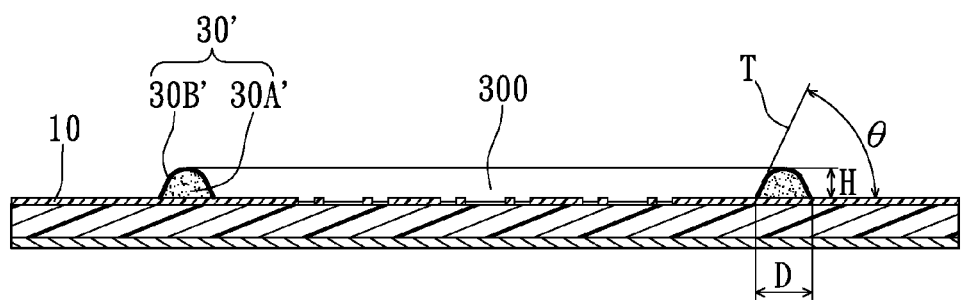
FIG. 9B shows a cross-sectional, schematic view of the step S204 according to the second embodiment of the instant disclosure.

Referring to FIGS. 8 and 9B, the method comprises: surroundingly forming surrounding liquid colloid 30" on the substrate body 10 (step S202), where the surrounding liquid colloid 30" can be formed as a predetermined shape (such as a circular shape, a square or a rectangular shape etc.) on the substrate body 10 by coating according to different requirements. The surrounding liquid colloid 30" can be surroundingly coated on the top surface of the substrate body 10 from an initial point to a terminal point, and the position of the initial point and the position of the terminal point are substantially the same.

Referring to FIGS. 8 and 9B, the method comprises: naturally drying an outer layer of the surrounding liquid colloid 30" at a predetermined room temperature (such as 25° or 20°~30°) without any curing device to form a semidrying surrounding light-reflecting frame 30', where the semidrying surrounding light-reflecting frame 30' has a non-drying surrounding colloid body 30A' (such as surrounding liquid colloid that is not to be dried) disposed on the substrate body 10 and a dried surrounding colloid body 30B' (such as surrounding solidifying colloid that is dried) totally covering the non-drying surrounding colloid body 30A' (step S204). For example, the semidrying surrounding light-reflecting frame 30' can be extended from an initial point to a terminal point, and the position of the initial point and the position of the terminal point are substantially the same, thus the semidrying surrounding light-reflecting frame 30' has a convex or concave junction portion (not shown) formed on the top surface thereof. Moreover, the semidrying surrounding light-reflecting frame 30' has an arc shape formed on the top surface thereof. The semidrying surrounding light-reflecting frame 30' has a radius tangent T and the angle θ of the radius tangent T relative to the top surface of the substrate body 10 may be between 40° and 50°. The maximum height H of the semidrying surrounding light-reflecting frame 30' relative to the top surface of the substrate body 10 may be between 0.3 mm and 0.7 mm, and the width D of the bottom side of the semidrying surrounding light-reflecting frame 30' may be between 1.5 mm and 3 mm. The thixotropic index of the semidrying surrounding light-reflecting frame 30' may be between 4 and 6, and the semidrying surrounding light-reflecting frame 30' may be formed by mixing inorganic additive with white thermohardening colloid. In addition, the semidrying surrounding light-reflecting frame 30' surrounds the light-emitting chips 20 to form a colloid position limiting space 300 on the chip-mounting area 11 of the substrate body 10.

Figure 9C:
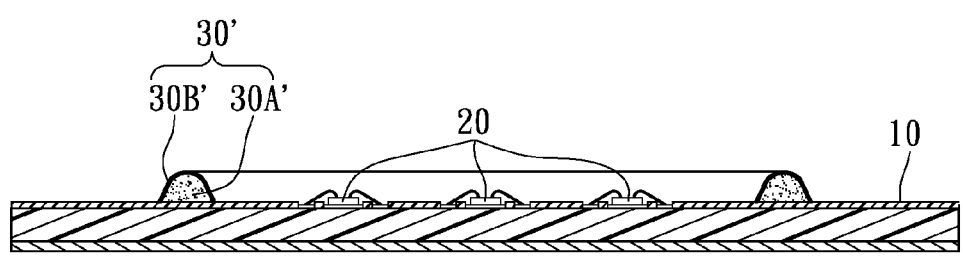
FIG. 9C shows a cross-sectional, schematic view of the step S206 according to the second embodiment of the instant disclosure.

Referring to FIGS. 8 and 9C, the method comprises: placing a plurality of light-emitting chips 20 on the substrate body 10, where the light-emitting chips 20 are electrically connected to the substrate body 10 and surrounded by the semidrying surrounding light-reflecting frame 30' (step S206). For example, each light-emitting chip may be a LED chip, and the light-emitting chips 20 can be electrically connected to the substrate body 10 by wire bonding.

Figure 9D:
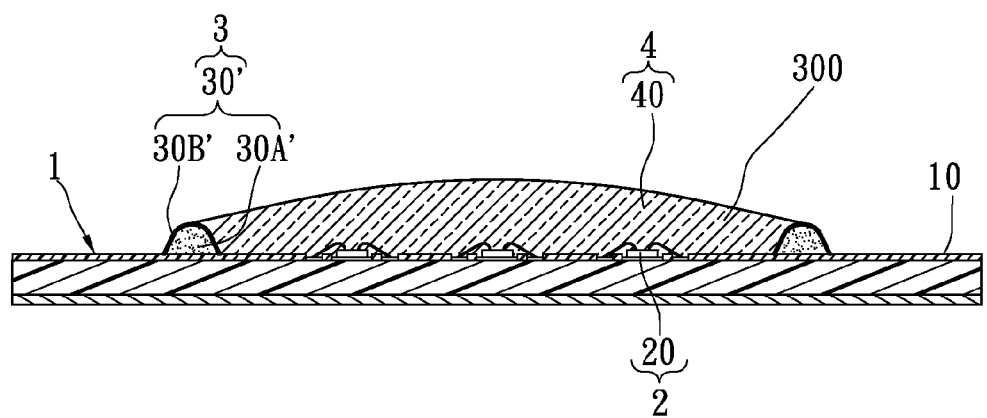
FIG. 9D shows a cross-sectional, schematic view of the step S208 according to the second embodiment of the instant disclosure.

Referring to FIGS. 8 and 9D, the method comprises: forming a package colloid body 40 on the substrate body 10 to cover the light-emitting chips 20, where the semidrying surrounding light-reflecting frame 30' contacts and surrounds the package colloid body 40 (step S208). For example, the package colloid body 40 may be a light-transmitting resin body inside the colloid position limiting space 300, and the package colloid body 40 has a convex top surface.

Hence, referring to FIG. 9D and the steps from S200 to S208, the second embodiment of the instant disclosure provides a multichip package structure for increasing the light-emitting efficiency and the light-projecting angle, comprising: a substrate unit 1, a light-emitting unit 2, a frame unit 3 and a package unit 4. The substrate unit 1 includes a substrate body 10. The light-emitting unit 2 includes a plurality of light-emitting chips 20 disposed on the substrate body 10 and electrically connected to the substrate body 10. The frame unit 3 includes a semidrying surrounding light-reflecting frame 30' surroundingly disposed on the substrate body 10. The light-emitting chips 20 are surrounded by the semidrying surrounding light-reflecting frame 30', and the semidrying surrounding light-reflecting frame 30' has a non-drying surrounding colloid body 30A' disposed on the substrate body 10 and a dried surrounding colloid body 30B' totally covering the non-drying surrounding colloid body 30A'. The package unit 4 includes a package colloid body 40 disposed on the substrate body 10 to cover the light-emitting chips 20, and the semidrying surrounding light-reflecting frame 30' contacts and surrounds the package colloid body 40.

Figure 9E:
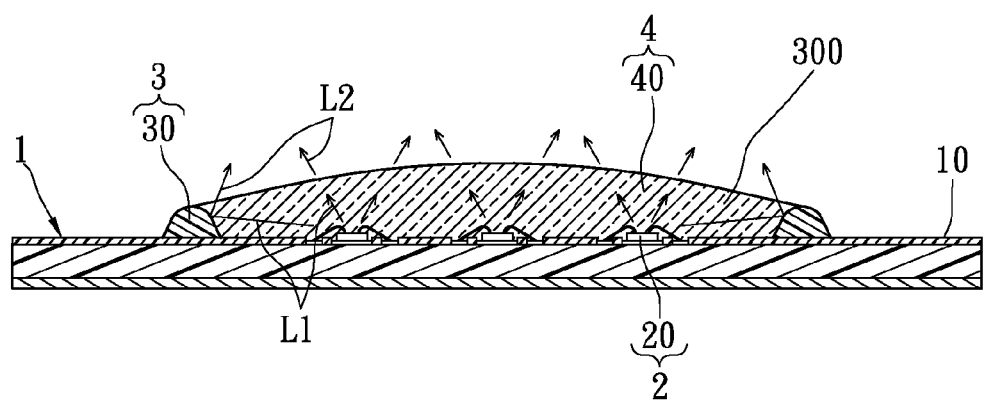
FIG. 9E shows a cross-sectional, schematic view of the step S210 according to the second embodiment of the instant disclosure.

Referring to FIGS. 8 and 9E, after the step of forming the package colloid body 40 (the step S208), the method further comprises: solidifying the semidrying surrounding light-reflecting frame 30' by natural drying at the predetermined room temperature or curing at a predetermined curing temperature to form a dried surrounding light-reflecting frame 30 (step S210). For example, in the first embodiment, each light-emitting chip 20 may be a blue LED chip, and the package colloid body 40 may be a phosphor resin body, thus blue light beams L1 generated by the light-emitting chips 20 (the blue LED chips) can pass through the package colloid body 40 (the phosphor resin body) to generate white light beams L2 that are similar to the light source generate by sun lamp.

Figure 10:
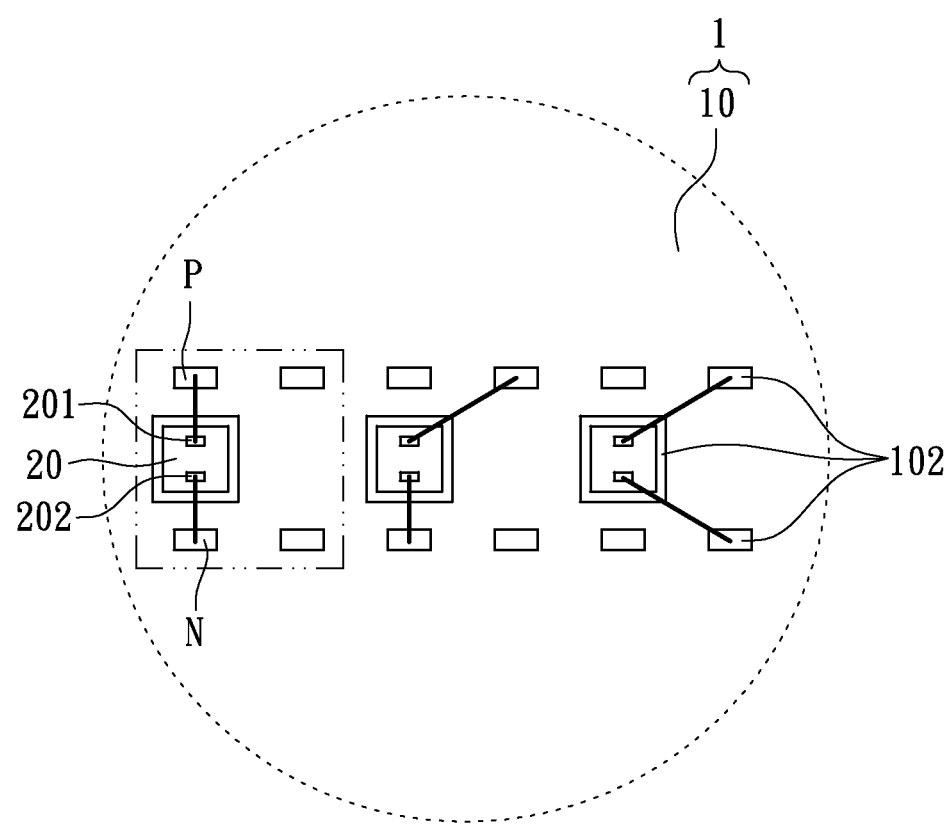
FIG. 10 shows a partial, top, schematic view of using a plurality of standby pads according to the instant disclosure.

Referring to FIG. 10, the substrate unit 1 includes a plurality of positive pads P disposed on the top surface of the substrate body 10 and a plurality of negative pads N disposed on the top surface of the substrate body 10. For the scope defined by the imaginary line in FIG. 10, each light-emitting chip 20 has a positive electrode 201 and a negative electrode 202, the positive electrode 201 of each light-emitting chip 20 corresponds to at least two of the positive pads P, and the negative electrode 202 of each light-emitting chip 20 corresponds to at least two of the negative pads N. In addition, the positive electrode 201 of each light-emitting chip 20 can be electrically connected to one of the two corresponding positive pads P by wire bonding, and the negative electrode 202 of each light-emitting chip 20 is electrically connected to one of the two corresponding negative pads N by wire bonding.

[Third Embodiment]

Figure 11:
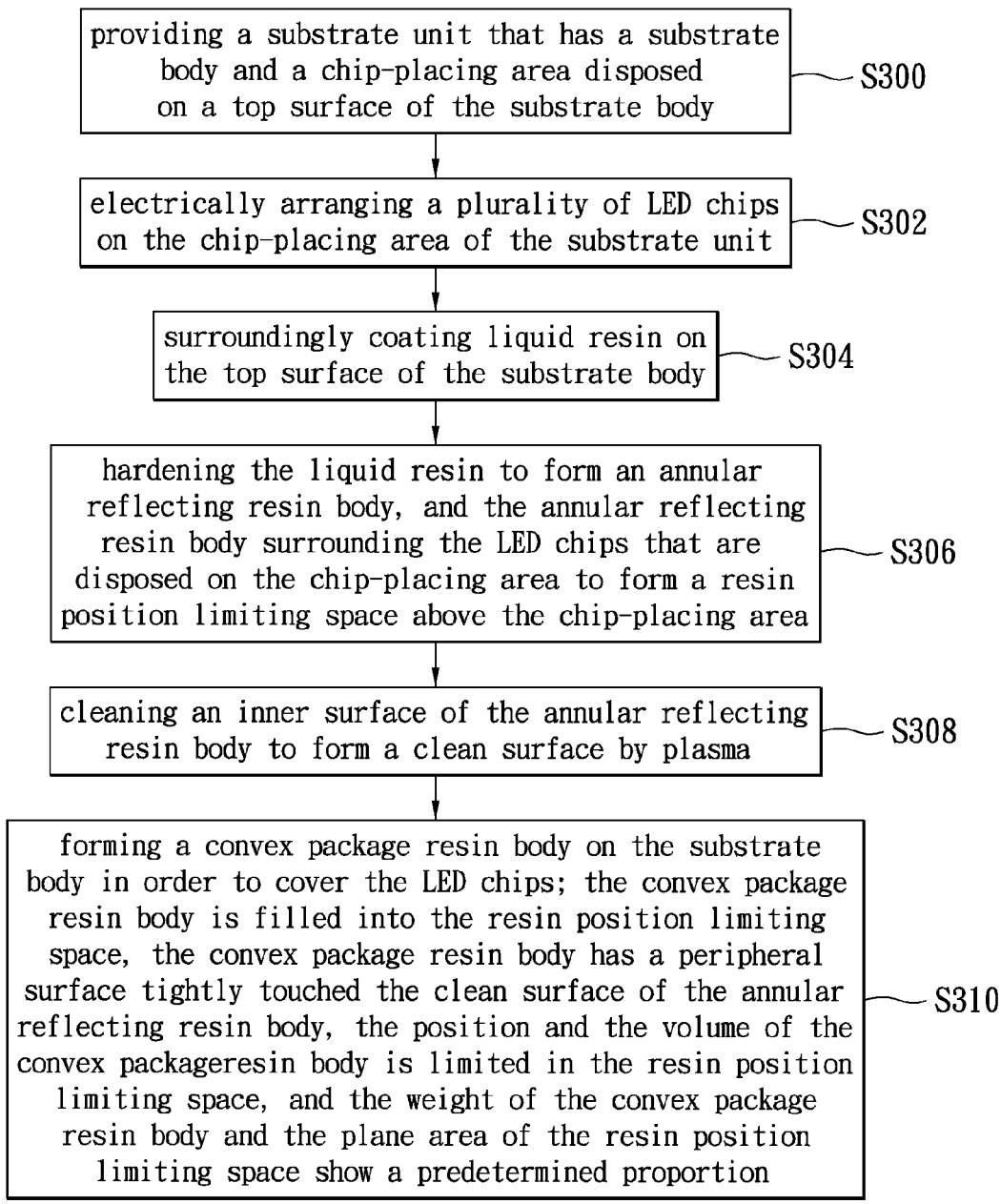
FIG. 11 is a flowchart of the method of manufacturing a LED package structure according to the third embodiment of the instant disclosure.

Referring to FIG. 11, the third embodiment of the instant disclosure provides a method of manufacturing a LED package structure for forming a stuffed convex lens to adjust light-projecting angle. The method includes: providing a substrate unit that has a substrate body and a chip-placing area disposed on a top surface of the substrate body; electrically arranging a plurality of LED chips on the chip-placing area of the substrate unit; surroundingly coating liquid resin on the top surface of the substrate body; hardening the liquid resin to form an annular reflecting resin body, and the annular reflecting resin body surrounding the LED chips that are disposed on the chip-placing area to form a resin position limiting space above the chip-placing area; cleaning an inner surface of the annular reflecting resin body to form a clean surface by plasma; and then forming a convex package resin body on the top surface of the substrate body in order to cover the LED chips (the convex package resin body is filled into the resin position limiting space, the convex package resin body has a peripheral surface tightly touched the clean surface of the annular reflecting resin body, the position and the volume of the convex package resin body is limited in the resin position limiting space, and the weight of the convex package resin body and the plane area of the resin position limiting space show a predetermined proportion).

Figure 11A:
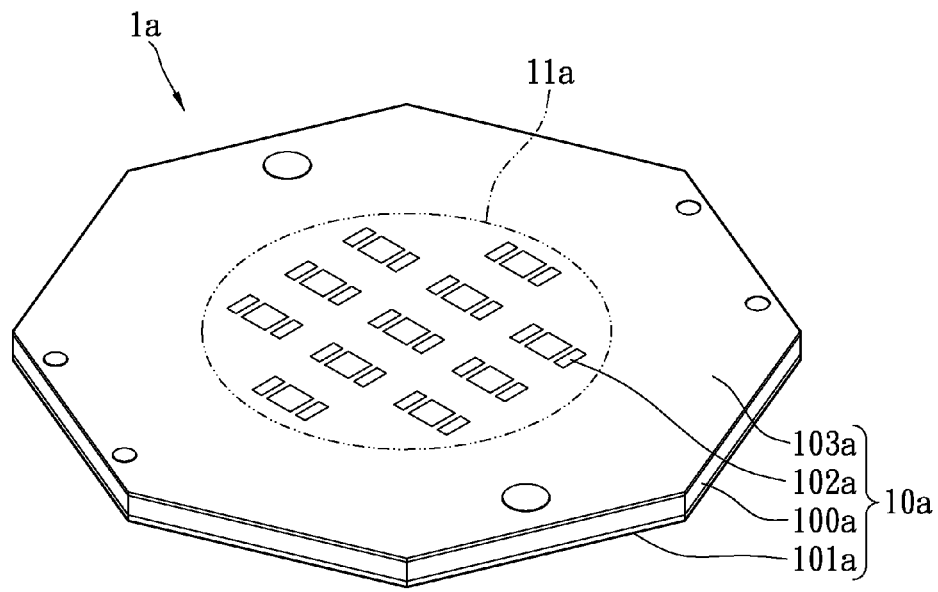
Figure 11B:
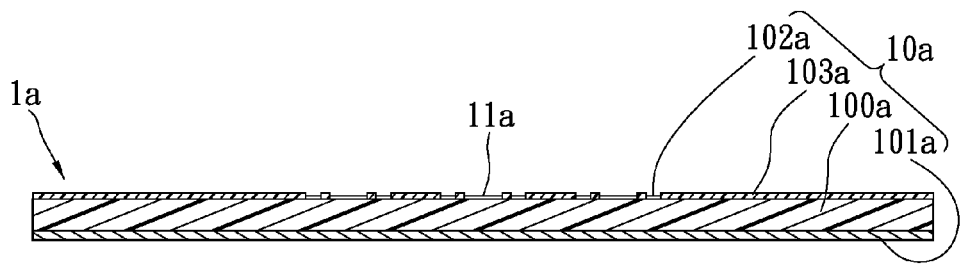

Referring to FIGS. 11 and 11A-14B, the detail descriptions of the third embodiment of the instant disclosure are shown as follows:

Referring to FIGS. 11 and 11A-11B (FIG. 11B is a cross-section of FIG. 11A), the method includes providing a substrate unit 1a that has a substrate body 10a and a chip-placing area 11a disposed on a top surface of the substrate body 10a (step S300). In addition, the substrate body 10a has a circuit substrate 100a, a heat-dissipating layer 101a disposed on a bottom surface of the circuit substrate 100a, a plurality of conductive pads 102a disposed on a top surface of the circuit substrate 100a, and an insulative layer 103a disposed on the top surface of the circuit substrate 100a in order to expose the conductive pads 102a. Hence, the heat-dissipating efficiency of the circuit substrate 100a is increased by using the heat-dissipating layer 101a, and the insulative layer 103a is a solder mask for exposing the conductive pads 102a only in order to achieve local soldering.

However, the above-mentioned definition of the substrate body 10a does not limit the instant disclosure. Any types of substrate can be applied to the instant disclosure. For example, the substrate body 10a can be a PCB (Printed Circuit Board), a flexible substrate, an aluminum substrate, a ceramic substrate, or a copper substrate.

Figure 12A:
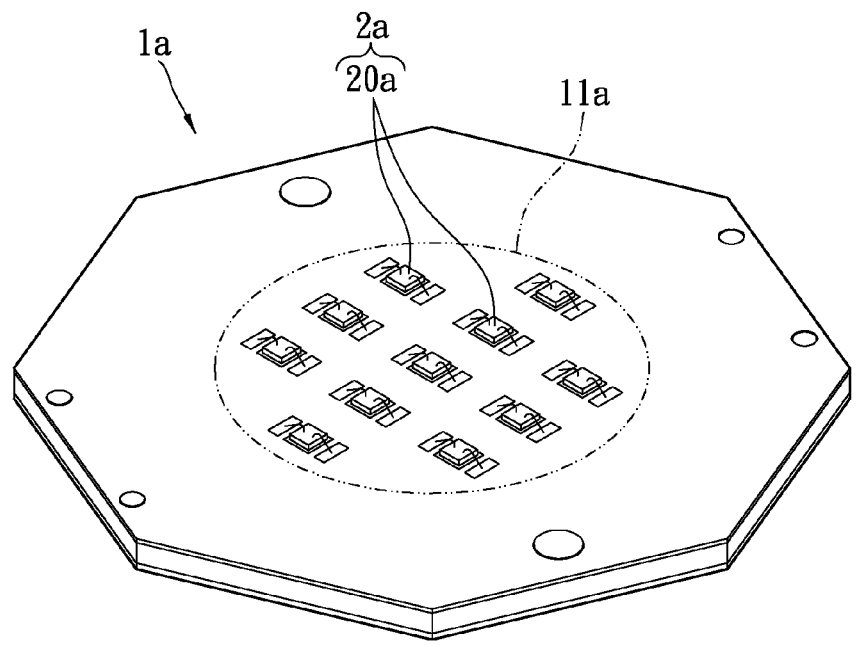
Figure 12B:
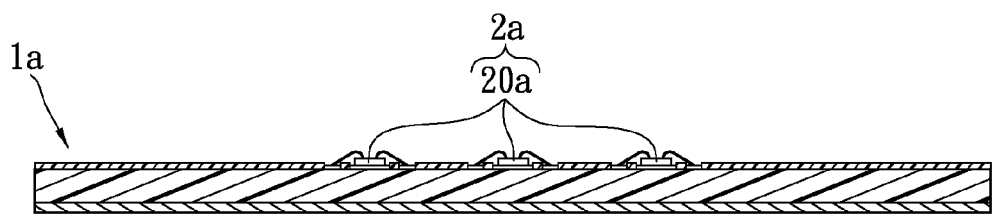

Referring to FIGS. 11 and 12A-12B (FIG. 12B is a cross-section of FIG. 12A), the method includes electrically arranging a plurality of LED chips 20a on the chip-placing area 11a of the substrate unit 1a (step S302). In other words, designer can plan a predetermined chip-placing area 11a on the substrate unit 1a in advance, so that the LED chips 20a can be placed on the chip-placing area 11a of the substrate unit 1a. In the third embodiment, the LED chips 20a are electrically disposed on the chip-placing area 11a of the substrate unit 1a by wire bonding.

Figure 13A:
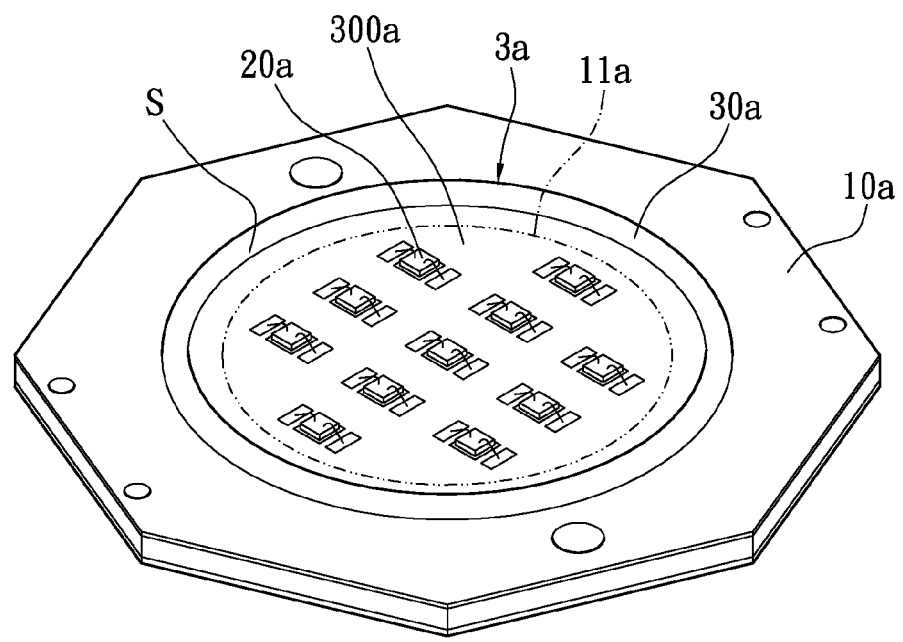
Figure 13B:
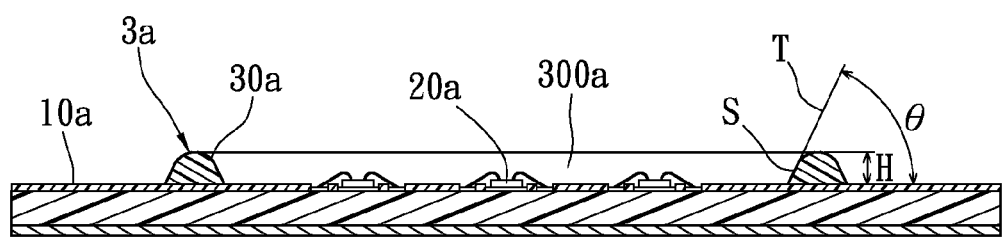

Referring to FIGS. 11 and 13A-13B (FIG. 13B is a cross-section of FIG. 13A), the method includes surroundingly coating liquid resin (not shown) on the top surface of the substrate body 10a (step S304). In addition, the liquid resin can be coated on the substrate body 10a by any shapes according to different requirements (such as a circular shape, a square or a rectangular shape etc.). The thixotropic index of the liquid resin is between 4 and 6, the pressure of coating the liquid resin on the top surface of the substrate body 10a is between 350 kpa and 450 kpa, and the velocity of coating the liquid resin on the top surface of the substrate body 10a is between 5 mm/s and 15 mm/s. The liquid resin is surroundingly coated on the top surface of the substrate body 10a from a start point to a termination point, and the position of the start point and the position of the termination point are the same. Furthermore, after the step S304, the method includes hardening the liquid resin to form an annular reflecting resin body 30a, and the annular reflecting resin body 30a surrounding the LED chips 20a that are disposed on the chip-placing area 11a to form a resin position limiting space 300a above the chip-placing area 11a (step S306). In addition, the liquid resin is hardened by baking (curing), the baking temperature is between 120° C. and 140° C., and the baking time is between 20 minute and 40 minute.

Moreover, the annular reflecting resin body 30a has an arc shape formed on a top surface thereof. The annular reflecting resin body 30a has a radius tangent T, and the angle θ of the radius tangent T relative to the top surface of the substrate body 10a is between 40° and 50°. The maximum height H of the annular reflecting resin body 30a relative to the top surface of the substrate body 10a is between 0.3 mm and 0.7 mm, and the width of a bottom side of the annular reflecting resin body 30a is between 1.5 mm and 3 mm. The thixotropic index of the annular reflecting resin body 30a is between 4 and 6. In addition, the resin position limiting space 300a has a cross section that can be a circular shape, an elliptical shape or a polygonal shape (such as a square or a rectangular shape etc). In the third embodiment, the cross section of the resin position limiting space 300a is a circular shape.

Referring to FIGS. 11 and 13A-13B (FIG. 13B is a cross-section of FIG. 13A), the method includes cleaning an inner surface of the annular reflecting resin body 30a to form a clean surface S by plasma (S308).

Figure 14A:
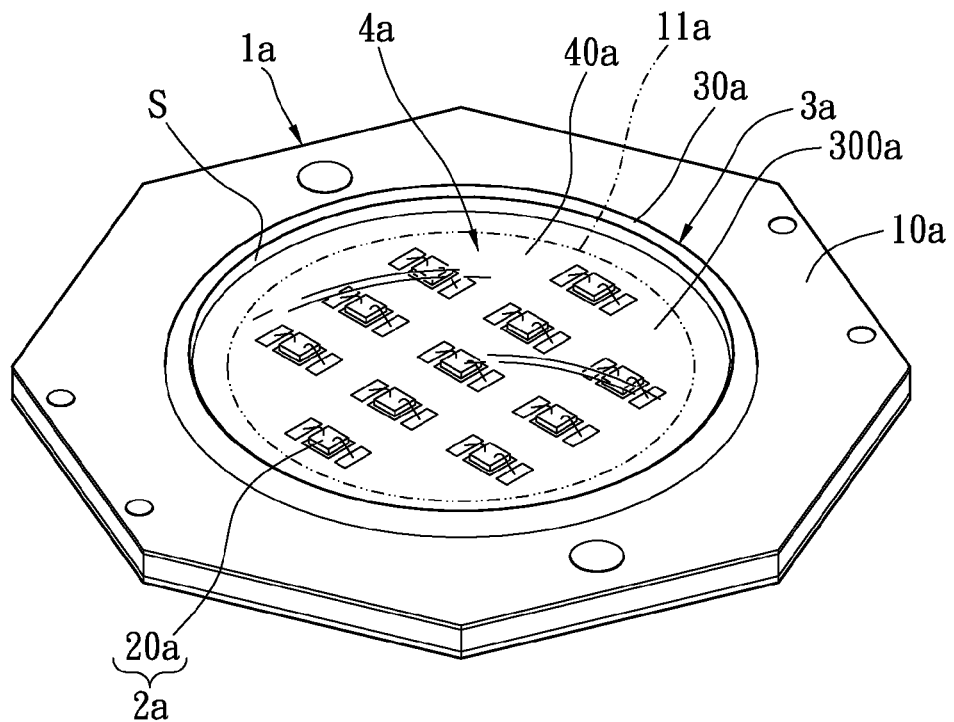
Figure 14B:
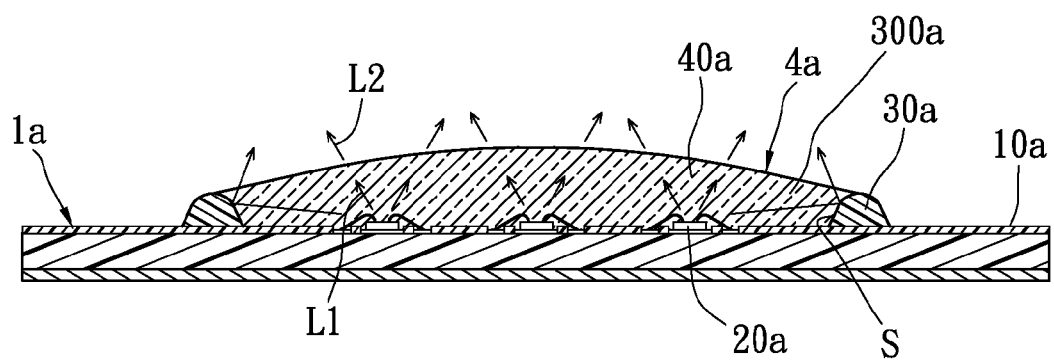

Referring to FIGS. 11 and 14A-14B (FIG. 14B is a cross-section of FIG. 14A), the method includes forming a convex package resin body 40a on the top surface of the substrate body 10a in order to cover the LED chips 20a; the convex package resin body 40a is filled into the resin position limiting space 300a, the convex package resin body 40a has a peripheral surface tightly touched the clean surface S of the annular reflecting resin body 30a, the position and the volume of the convex package resin body 40a is limited in the resin position limiting space 300a, and the weight of the convex package resin body 40a and the plane area of the resin position limiting space 300a show a predetermined proportion (step S310). In addition, the annular reflecting resin body 30a can be a white thermohardening reflecting body (opaque resin) mixed with inorganic additive, and the top surface of the convex package resin body 40a is convex. The convex package resin body 40a can be translucent or transparent.

Moreover, the viscosity of the convex package resin body 40a can be 900±200 cps (centipoises). The resin position limiting space 300a can be a circular form, a square or any shape. For example, when the resin position limiting space 300a is a circular form, the predetermined proportion of the weight of the convex package resin body and the plane area of the resin position limiting space is 0.5±0.05 g: 572±0.5 mm$^2$ or 1.5±0.05 g: 1320±0.5 mm$^2$. When the resin position limiting space 300a is a square, the predetermined proportion of the weight of the convex package resin body and the plane area of the resin position limiting space is 0.5±0.05 g: 800±0.5 mm$^2$.

In the third embodiment, each LED chip 20a can be a blue LED chip, and the convex package resin body 40a can be a phosphor body. Hence, blue light beams L1 generated by the LED chips 20a (the blue LED chips) can pass through the convex package resin body 40a (the phosphor body) to generate white light beams L2 that are similar to the light source generate by sun lamp.

In other words, the convex package resin body 40a is limited in the resin position limiting space 300a by using the annular reflecting resin body 30a in order to control the usage quantity of the convex package resin body 40a. In addition, the surface shape and the height of the convex package resin body 40a can be adjusted by control the usage quantity of the convex package resin body 40a in order to light-projecting angles of the white light beams L2. Moreover, the blue light beams L1 generated by the LED chips 20a can be reflected by an inner wall of the annular reflecting resin body 30a in order to increase the light-emitting efficiency of the LED package structure of the instant disclosure.

[Fourth Embodiment]

Figure 15:
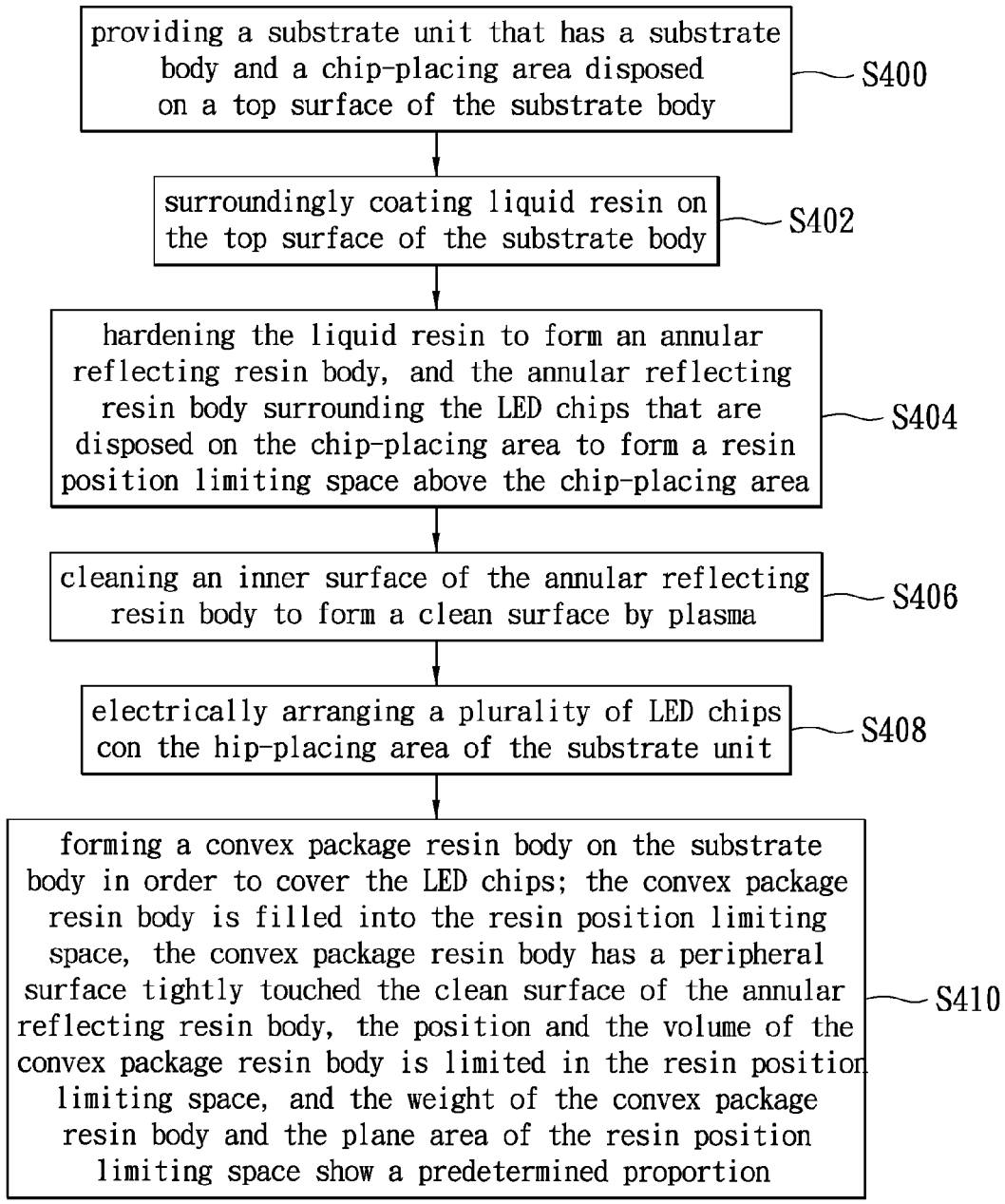
FIG. 15 is a flowchart of the method of manufacturing a LED package structure according to the fourth embodiment of the instant disclosure.

Referring to FIG. 15, the fourth embodiment of the instant disclosure provides a method of manufacturing a LED package structure for forming a stuffed convex lens to adjust light-projecting angle. The method includes: providing a substrate unit that has a substrate body and a chip-placing area disposed on a top surface of the substrate body; surroundingly coating liquid resin on the top surface of the substrate body; hardening the liquid resin to form an annular reflecting resin body, and the annular reflecting resin body surrounding the LED chips that are disposed on the chip-placing area to form a resin position limiting space above the chip-placing area; cleaning an inner surface of the annular reflecting resin body to form a clean surface by plasma; electrically arranging a plurality of LED chips on the chip-placing area of the substrate unit; and then forming a convex package resin body on the top surface of the substrate body in order to cover the LED chips (the convex package resin body is filled into the resin position limiting space, the convex package resin body has a peripheral surface tightly touched the clean surface of the annular reflecting resin body, the position and the volume of the convex package resin body is limited in the resin position limiting space, and the weight of the convex package resin body and the plane area of the resin position limiting space show a predetermined proportion).

Figure 15A:
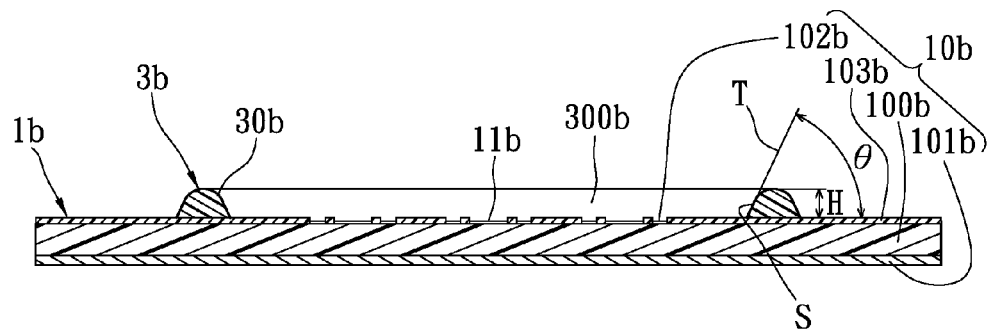
FIGS. 15A to 15C are schematic views of the LED package structure according to the fourth embodiment of the instant disclosure, at different stages of the packaging processes, respectively.

Referring to FIGS. 15 and 15A-15C, the detail descriptions of the fourth embodiment of the instant disclosure are shown as follows:

Referring to FIGS. 15 and 15A, the method includes providing a substrate unit 1b that has a substrate body 10b and a chip-placing area 11b disposed on a top surface of the substrate body 10b (step S400). In addition, the substrate body 10b has a circuit substrate 100b, a heat-dissipating layer 101b disposed on a bottom surface of the circuit substrate 100b, a plurality of conductive pads 102b disposed on a top surface of the circuit substrate 100b, and an insulative layer 103b disposed on the top surface of the circuit substrate 100b in order to expose the conductive pads 102b.

Referring to FIGS. 15 and 15A, the method includes surroundingly coating liquid resin (not shown) on the top surface of the substrate body 10b (step S402). In addition, the liquid resin can be coated on the substrate body 10b by any shapes according to different requirements (such as a circular shape, a square or a rectangular shape etc.). The thixotropic index of the liquid resin is between 4 and 6, the pressure of coating the liquid resin on the top surface of the substrate body 10b is between 350 kpa and 450 kpa, and the velocity of coating the liquid resin on the top surface of the substrate body 10b is between 5 mm/s and 15 mm/s. The liquid resin is surroundingly coated on the top surface of the substrate body 10b from a start point to a termination point, and the position of the start point and the position of the termination point are the same. Furthermore, after the step S402, the method includes hardening the liquid resin to form an annular reflecting resin body 30b, and the annular reflecting resin body 30b surrounding the LED chips 20b that are disposed on the chip-placing area 11b to form a resin position limiting space 300b above the chip-placing area 11b (step S404). In addition, the liquid resin is hardened by baking, the baking temperature is between 120° C. and 140° C., and the baking time is between 20 minute and 40 minute.

Moreover, the annular reflecting resin body 30b has an arc shape formed on a top surface thereof. The annular reflecting resin body 30b has a radius tangent T, and the angle θ of the radius tangent T relative to the top surface of the substrate body 10b is between 40° and 50°. The maximum height H of the annular reflecting resin body 30b relative to the top surface of the substrate body 10b is between 0.3 mm and 0.7 mm, and the width of a bottom side of the annular reflecting resin body 30b is between 1.5 mm and 3 mm. The thixotropic index of the annular reflecting resin body 30b is between 4 and 6. In addition, the resin position limiting space 300b has a cross section that can be a circular shape, an elliptical shape or a polygonal shape (such as a square or a rectangular shape etc).

Referring to FIGS. 15 and 15A, the method includes cleaning an inner surface of the annular reflecting resin body 30b to form a clean surface S by plasma (S406).

Figure 15B:
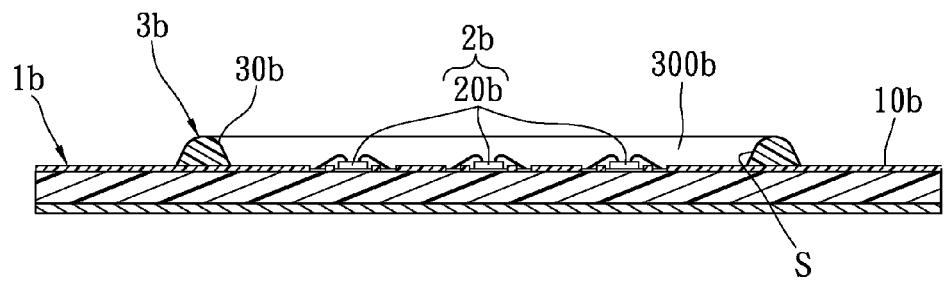

Referring to FIGS. 15 and 15B, the method includes electrically arranging a plurality of LED chips 20b on the chip-placing area 11b of the substrate unit 1b (step S408). In other words, designer can plan a predetermined chip-placing area 11b on the substrate unit 1b in advance, so that the LED chips 20b can be placed on the chip-placing area 11b of the substrate unit 1b by wire bonding.

Of course, the steps of S406 and S408 can be reverse. In other words, firstly, the LED chips 20b can be electrically disposed on the chip-placing area 11b of the substrate unit 1b, and next the inner surface of the annular reflecting resin body 30b is cleaned to form a clean surface S by plasma.

Figure 15C:
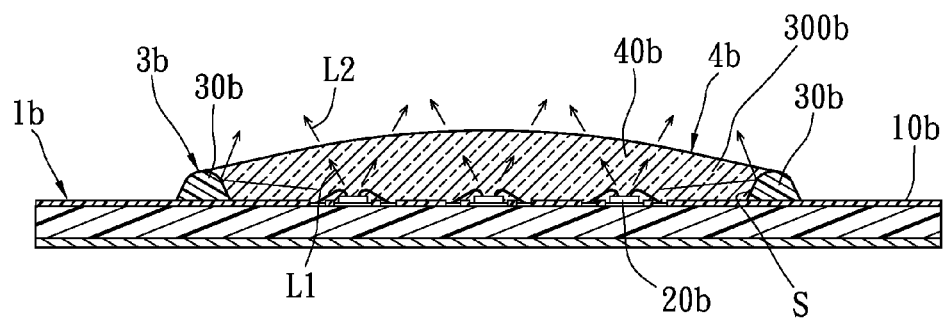

Referring to FIGS. 15 and 15C, the method includes forming a convex package resin body 40b on the top surface of the substrate body 10b in order to cover the LED chips 20b; the convex package resin body 40b is filled into the resin position limiting space 300b, the convex package resin body 40b has a peripheral surface tightly touched the clean surface S of the annular reflecting resin body 30b, the position and the volume of the convex package resin body 40b is limited in the resin position limiting space 300b, and the weight of the convex package resin body 40b and the plane area of the resin position limiting space 300b show a predetermined proportion (step S410). In addition, the annular reflecting resin body 30b can be a white thermohardening reflecting body (opaque resin) mixed with inorganic additive, and the top surface of the convex package resin body 40b is convex.

Moreover, the viscosity of the convex package resin body 40a can be 900±200 cps (centipoises). The resin position limiting space 300a can be a circular form, a square or any shape. For example, when the resin position limiting space 300a is a circular form, the predetermined proportion of the weight of the convex package resin body and the plane area of the resin position limiting space is 0.5±0.05 g: 572±0.5 mm$^2$ or 1.5±0.05 g: 1320±0.5 mm$^2$. When the resin position limiting space 300a is a square, the predetermined proportion of the weight of the convex package resin body and the plane area of the resin position limiting space is 0.5±0.05 g: 800±0.5 mm$^2$.

In the fourth embodiment, each LED chip 20b can be a blue LED chip, and the convex package resin body 40b can be a phosphor body. Hence, blue light beams L1 generated by the LED chips 20b (the blue LED chips) can pass through the convex package resin body 40b (the phosphor body) to generate white light beams L2 that are similar to the light source generate by sun lamp.

Hence, referring to FIGS. 11 and 15, the instant disclosure provides a method of manufacturing a LED package structure for forming a stuffed convex lens to adjust light-projecting angle, including: providing a substrate unit, and the substrate unit having a substrate body and a chip-placing area disposed on a top surface of the substrate body; and then selectively executing step (a) or (b). The step (a) is: electrically arranging a plurality of LED chips on the chip-placing area of the substrate unit, surroundingly coating liquid resin on the top surface of the substrate body, hardening the liquid resin to form an annular reflecting resin body, and then cleaning an inner surface of the annular reflecting resin body to form a clean surface by plasma. The step (b) is: surroundingly coating liquid resin on the top surface of the substrate body, hardening the liquid resin to form an annular reflecting resin body, cleaning an inner surface of the annular reflecting resin body to form a clean surface by plasma, and then electrically arranging a plurality of LED chips on the chip-placing area of the substrate unit. The annular reflecting resin body surrounds the LED chips that are disposed on the chip-placing area to form a resin position limiting space above the chip-placing area. Final, the method includes forming a convex package resin body on the top surface of the substrate body in order to cover the LED chips (the convex package resin body is filled into the resin position limiting space, the convex package resin body has a peripheral surface tightly touched the clean surface of the annular reflecting resin body, the position and the volume of the convex package resin body is limited in the resin position limiting space, and the weight of the convex package resin body and the plane area of the resin position limiting space show a predetermined proportion).

Furthermore, referring to FIGS. 14A, 14B and 15C, the instant disclosure provides a LED package structure for forming a stuffed convex lens to adjust light-projecting angle by using the above-mentioned manufacturing method. The LED package structure includes a substrate unit (1a, 1b), a light-emitting unit (2a, 2b), a light-reflecting unit (3a, 3b) and a convex package unit (4a, 4b).

The substrate unit (1a, 1b) has a substrate body (10a, 10b) and a chip-placing area (11a, 11b) disposed on a top surface of the substrate body (10a, 10b). The light-emitting unit (2a, 2b) has a plurality of LED chips (20a, 20b) electrically disposed on the chip-placing area (11a, 11b).

Moreover, the light-reflecting unit (3a, 3b) has an annular reflecting resin body (30a, 30b) surroundingly formed on the top surface of the substrate body (10a, 10b) by coating. The annular reflecting resin body (30a, 30b) surrounds the LED chips (20a, 20b) that are disposed on the chip-placing area (11a, 11b) to form a resin position limiting space (300a, 300b) above the chip-placing area (11a, 11b), and the annular reflecting resin body (3a, 3b) has an inner surface that has been cleaned by plasma to form a clean surface S.

In addition, the convex package unit (4a, 4b) has a convex package resin body (40a, 40b) disposed on the top surface of the substrate body (10a, 10b) in order to cover the LED chips (20a, 20b). In addition, the convex package resin body (40a, 40b) is filled into the resin position limiting space (300a, 300b), the convex package resin body (40a, 40b) has a peripheral surface tightly touched the clean surface S of the annular reflecting resin body (30a, 30b), the position and the volume of the convex package resin body (40a, 40b) is limited in the resin position limiting space (300a, 300b), and the weight of the convex package resin body (40a, 40b) and the plane area of the resin position limiting space (300a, 300b) show a predetermined proportion.

Furthermore, the substrate unit (1a, 1b) and the light-reflecting unit (3a, 3b) can be combined to form a LED package structure for forming a stuffed convex lens to adjust light-projecting angle. In other words, any types of light-emitting elements can be applied to the LED package structure.

[Fifth Embodiment]

Figure 16A:
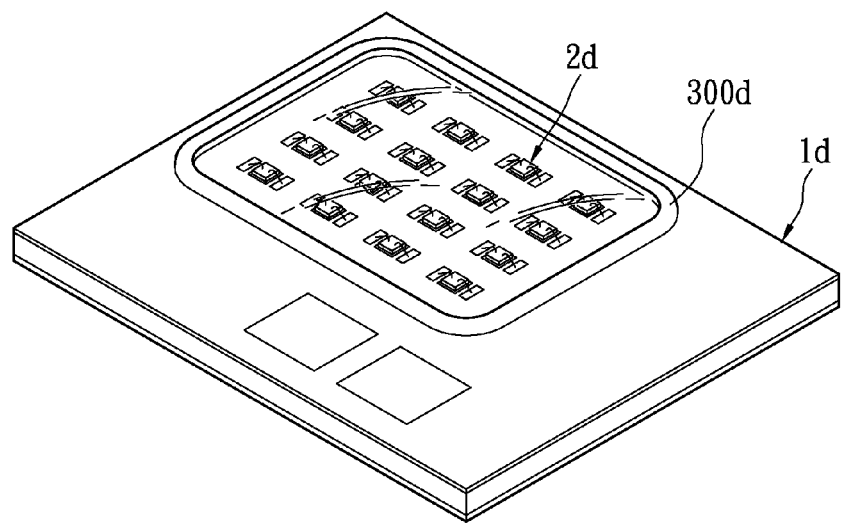
FIG. 16A is a perspective, schematic view of the LED package structure according to the fifth embodiment of the instant disclosure.
Figure 16B:
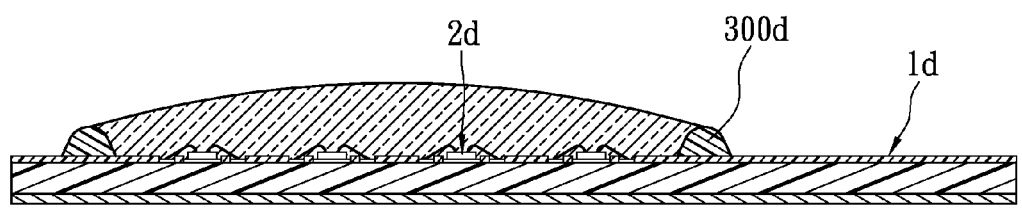
FIG. 16B is a cross-sectional, schematic view of the LED package structure according to the fifth embodiment of the instant disclosure.

Referring to FIGS. 16A and 16B, the difference between the fifth embodiment and the third and the fourth embodiments is that: in the fifth embodiment, the resin position limiting space 300d has a cross section as a square. Hence, the LED package structure of the fifth embodiment can generate a light-emitting area similar to a square. In other words, the cross-sectional area of the substrate unit 1d is increased (the heat-dissipating area of the substrate unit 1d is increased) in order to increase the heat-dissipating efficiency of the light-emitting unit 2d.

[Sixth Embodiment]

Figure 17A:
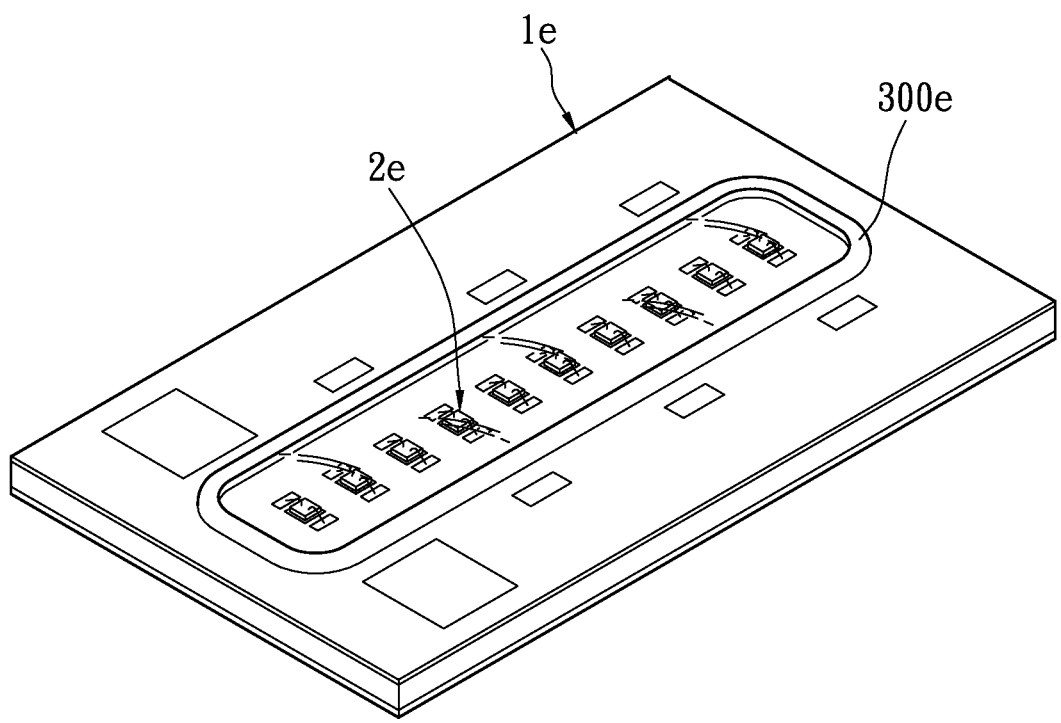
FIG. 17A is a perspective, schematic view of the LED package structure according to the sixth embodiment of the instant disclosure.
Figure 17B:
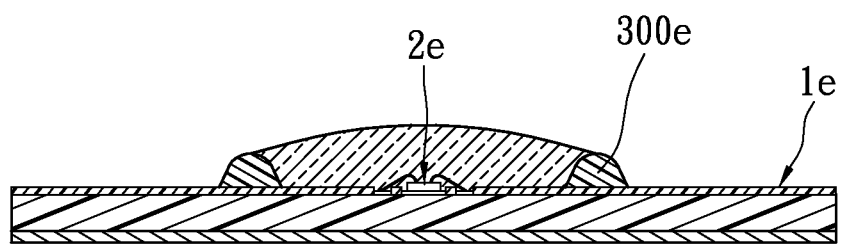
FIG. 17B is a cross-sectional, schematic view of the LED package structure according to the sixth embodiment of the instant disclosure.

Referring to FIGS. 17A and 17B, the difference between the sixth embodiment and the third and the fourth embodiments is that: in the sixth embodiment, the resin position limiting space 300e has a cross section as a rectangular form. Hence, the LED package structure of the sixth embodiment can generate a light-emitting area similar to a long strip shape. In other words, the cross-sectional area of the substrate unit 1e is increased (the heat-dissipating area of the substrate unit 1e is increased) in order to increase the heat-dissipating efficiency of the light-emitting unit 2e.

In conclusion, the semidrying surrounding light-reflecting frame 30' can be formed on the substrate body 10 without using any frame mold in the instant disclosure. Moreover, the instant disclosure can form an annular reflecting resin body (an annular white resin body) with any shapes by coating method. In addition, the position of a convex package resin body such as phosphor resin can be limited in the resin position limiting space by using the annular reflecting resin body, and the shape of the convex package resin body can be adjusted by using the annular reflecting resin body. Therefore, the instant disclosure can apply to increase light-emitting efficiency of LED chips and control light-projecting angle of LED chips.

In other words, the convex package resin body is limited in the resin position limiting space by using the annular reflecting resin body in order to control the usage quantity of the convex package resin body. In addition, the surface shape and the height of the convex package resin body can be adjusted by control the usage quantity of the convex package resin body in order to light-projecting angles of the white light beams. Moreover, the blue light beams generated by the LED chips can be reflected by an inner wall of the annular reflecting resin body in order to increase the light-emitting efficiency of the LED package structure of the instant disclosure.

Moreover, the inner surface of the annular reflecting resin body is cleaned by plasma to form a clean surface, so that the peripheral surface can be tightly touched the clean surface of the annular reflecting resin body. In addition, the weight of the convex package resin body (40a, 40b) and the plane area of the resin position limiting space (300a, 300b) show a predetermined proportion.

The above-mentioned descriptions merely represent the preferred embodiments of the instant disclosure, without any intention or ability to limit the scope of the instant disclosure which is fully described only within the following claims. Various equivalent changes, alterations or modifications based on the claims of instant disclosure are all, consequently, viewed as being embraced by the scope of the instant disclosure.

What is claimed is:

1. A method of manufacturing a multichip package structure, comprising the steps of:
    providing a substrate body;
    placing a plurality of light-emitting chips on the substrate body, wherein the light-emitting chips are electrically connected to the substrate body;
    surroundingly forming surrounding liquid colloid on the substrate body to surround the light-emitting chips;
    forming a semidrying surrounding light-reflecting frame by naturally drying the surrounding liquid colloid at a predetermined room temperature between 20° C.-30° C. until the surrounding liquid colloid forms a dried colloid outer layer and a non-drying colloid body without using any curing device, the dried colloid outer layer covering the non-drying colloid body, and the dried colloid outer layer and the non-drying colloid body to forming the semidrying surrounding light-reflecting frame;
    forming a package colloid body on the substrate body to cover the light-emitting chips while the non-drying colloid body of the semidrying surrounding light-reflecting frame is further naturally drying at the predetermined room temperature between 20° C.-30° C., wherein the semidrying surrounding light-reflecting frame contacts and surrounds the package colloid body; and
    after forming a package colloid body on the substrate body to cover the light-emitting chips, the non-drying colloid body of the semidrying surrounding light-reflecting frame is further naturally drying at the predetermined room temperature between 20° C.-30° C. until completely dried, and thus the semidrying surrounding light-reflecting frame becomes a dried surrounding light-reflecting frame, the dried surrounding light-reflecting frame being in a solid state;
    wherein the semidrying surrounding light-reflecting frame has an arc shape formed on the top surface of the semidrying surrounding light-reflecting frame, the semidrying surrounding light-reflecting frame has a radius tangent and the angle of the radius tangent relative to the top surface of the substrate body is between 40° and 50°, the maximum height of the semidrying surrounding light-reflecting frame relative to the top surface of the substrate body is between 0.3 mm and 0.7 mm, the width of the bottom side of the semidrying surrounding light-reflecting frame is between 1.5 mm and 3 mm, the thixotropic index of the semidrying surrounding light-reflecting frame is between 4 and 6, and the semidrying surrounding light-reflecting frame is formed by mixing inorganic additive with white thermohardening colloid;
    wherein the viscosity of the package colloid body is 900+200 cps (centipoises).

2. The method of claim 1, wherein the semidrying surrounding light-reflecting frame has a convex junction portion or a concave junction portion formed on the top surface of the semidrying surrounding light-reflecting frame.

3. The method of claim 1, wherein the semidrying surrounding light-reflecting frame is annularly extended from an initial point to a terminal point, and the position of the initial point and the position of the terminal point are substantially overlapping.

4. The method of claim 1, wherein the substrate unit includes a plurality of positive pads disposed on the top surface of the substrate body and a plurality of negative pads disposed on the top surface of the substrate body, wherein each light-emitting chip has a positive electrode and a negative electrode, the positive electrode of each light-emitting chip corresponds to at least two of the positive pads, and the negative electrode of each light-emitting chip corresponds to at least two of the negative pads.

5. The method of claim 4, wherein the positive electrode of each light-emitting chip is electrically connected to one of the two corresponding positive pads, and the negative electrode of each light-emitting chip is electrically connected to one of the two corresponding negative pads.

6. A method of manufacturing a multichip package structure, comprising the steps of:
    providing a substrate body;
    surroundingly forming surrounding liquid colloid on the substrate body;

forming a semidrying surrounding light-reflecting frame by naturally drying the surrounding liquid colloid at a predetermined room temperature between 20° C.-30° C. until the surrounding liquid colloid forms a dried colloid outer layer and a non-drying colloid body without using any curing device, the dried colloid outer layer covering the non-drying colloid body, and the dried colloid outer layer and the non-drying colloid body to forming the semidrying surrounding light-reflecting frame;

placing a plurality of light-emitting chips on the substrate body while the non-drying colloid body of the semidrying surrounding light-reflecting frame is naturally drying at the predetermined room temperature between 20° C.-30° C., wherein the light-emitting chips are electrically connected to the substrate body and surrounded by the semidrying surrounding light-reflecting frame;

forming a package colloid body on the substrate body to cover the light-emitting chips while the non-drying colloid body of the semidrying surrounding light-reflecting frame is further naturally drying at the predetermined room temperature between 20° C.-30° C., wherein the semidrying surrounding light-reflecting frame contacts and surrounds the package colloid body; and after forming a package colloid body on the substrate body to cover the light-emitting chips, the non-drying colloid body of the semidrying surrounding light-reflecting frame is further naturally drying at the predetermined room temperature between 20° C.-30° C. until completely dried, and thus the semidrying surrounding light-reflecting frame becomes a dried surrounding light-reflecting frame, the dried surrounding light-reflecting frame being in a solid state;

wherein the semidrying surrounding light-reflecting frame has an arc shape formed on the top surface of the semidrying surrounding light-reflecting frame, the semidrying surrounding light-reflecting frame has a radius tangent and the angle of the radius tangent relative to the top surface of the substrate body is between 40° and 50°, the maximum height of the semidrying surrounding light-reflecting frame relative to the top surface of the substrate body is between 0.3 mm and 0.7 mm, the width of the bottom side of the semidrying surrounding light-reflecting frame is between 1.5 mm and 3 mm, the thixotropic index of the semidrying surrounding light-reflecting frame is between 4 and 6, and the semidrying surrounding light-reflecting frame is formed by mixing inorganic additive with white thermohardening colloid;

wherein the viscosity of the package colloid body is 900±200 cps (centipoises).

7. The method of claim 6, wherein the semidrying surrounding light-reflecting frame has a convex junction portion or a concave junction portion formed on the top surface of the semidrying surrounding light-reflecting frame.

8. The method of claim 6, wherein the semidrying surrounding light-reflecting frame is annularly extended from an initial point to a terminal point, and the position of the initial point and the position of the terminal point are substantially overlapping.

9. The method of claim 6, wherein the substrate unit includes a plurality of positive pads disposed on the top surface of the substrate body and a plurality of negative pads disposed on the top surface of the substrate body, wherein each light-emitting chip has a positive electrode and a negative electrode, the positive electrode of each light-emitting chip corresponds to at least two of the positive pads, and the negative electrode of each light-emitting chip corresponds to at least two of the negative pads.

10. The method of claim 9, wherein the positive electrode of each light-emitting chip is electrically connected to one of the two corresponding positive pads, and the negative electrode of each light-emitting chip is electrically connected to one of the two corresponding negative pads.

* * * * *